United States Patent
Choi et al.

(10) Patent No.: US 11,372,551 B2
(45) Date of Patent: Jun. 28, 2022

(54) MEMORY CONTROLLERS FOR PERFORMING STATE SHAPING OPERATION, MEMORY SYSTEMS INCLUDING THE MEMORY CONTROLLERS, AND METHODS OF OPERATING THE SAME

(71) Applicant: Samsung Electronics Co., Ltd., Suwon-si (KR)

(72) Inventors: Byungyong Choi, Seongnam-si (KR); Doohyun Kim, Hwaseong-si (KR); Changkyu Seol, Osan-si (KR); Ilhan Park, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 63 days.

(21) Appl. No.: 16/898,935

(22) Filed: Jun. 11, 2020

(65) Prior Publication Data

US 2021/0034251 A1 Feb. 4, 2021

(30) Foreign Application Priority Data

Aug. 1, 2019 (KR) .................. 10-2019-0094021

(51) Int. Cl.
*G06F 3/06* (2006.01)
*G11C 16/04* (2006.01)
(Continued)

(52) U.S. Cl.
CPC .......... *G06F 3/0614* (2013.01); *G06F 3/0658* (2013.01); *G06F 3/0679* (2013.01);
(Continued)

(58) Field of Classification Search
CPC .... G06F 3/0614; G06F 3/0658; G06F 3/0679; G06F 3/0604; G06F 11/1044;
(Continued)

(56) References Cited

U.S. PATENT DOCUMENTS 7,577,036 B2 8/2009 Sarin et al.
7,606,966 B2 10/2009 Li et al.
(Continued)

FOREIGN PATENT DOCUMENTS

CN 102157204 B * 5/2016 ......... G11C 11/5671
JP 2008-130182 A 6/2008
(Continued)

*Primary Examiner* — Fernando Hidalgo
(74) *Attorney, Agent, or Firm* — Harness, Dickey & Pierce, P.L.C.

(57) ABSTRACT

A method of operating a memory controller, the method including performing a state shaping operation on received data based on state shaping information in response to a write request, the received data and the write request being received from a host, the state shaping information representing a memory cell characteristic corresponding to a memory cell group on which the received data is to be programmed, and the state shaping information being received from a memory device, and transmitting transformation data to the memory device, the transformation data being generated through the state shaping operation.

17 Claims, 28 Drawing Sheets

(51) Int. Cl.
*G11C 16/26* (2006.01)
*G11C 16/10* (2006.01)

(52) U.S. Cl.
CPC .......... *G11C 16/0483* (2013.01); *G11C 16/10* (2013.01); *G11C 16/26* (2013.01)

(58) Field of Classification Search
CPC .... G06F 3/0619; G06F 3/0634; G06F 3/0644; G11C 16/0483; G11C 16/10; G11C 16/26; G11C 16/349; G11C 11/5628
USPC .......................................................... 711/103
See application file for complete search history.

(56) References Cited

U.S. PATENT DOCUMENTS

| | | | |
|---|---|---|---|
| 7,734,861 B2 | 6/2010 | Li et al. | |
| 8,174,895 B2 | 5/2012 | Chen et al. | |
| 8,230,158 B2 | 7/2012 | Ruby et al. | |
| 8,270,227 B2 | 9/2012 | Park et al. | |
| 8,472,257 B2 | 6/2013 | Dong et al. | |
| 8,595,422 B2 | 11/2013 | Ruby et al. | |
| 8,694,720 B2 | 4/2014 | Lee et al. | |
| 8,737,125 B2 | 5/2014 | Pan et al. | |
| 9,164,881 B2 | 10/2015 | Seol et al. | |
| 9,734,898 B2 | 8/2017 | Seol et al. | |
| 9,767,306 B2 | 9/2017 | Klum | |
| 9,959,077 B2 | 5/2018 | Lee et al. | |
| 10,175,915 B2 | 1/2019 | Lee et al. | |
| 2009/0135656 A1* | 5/2009 | Park | G11C 29/50004 365/185.19 |
| 2011/0119432 A1 | 5/2011 | Yoon | |
| 2014/0032824 A1 | 1/2014 | Park | |
| 2017/0090764 A1 | 3/2017 | Lien | |
| 2019/0258423 A1* | 8/2019 | Rozman | G06F 3/0679 |

FOREIGN PATENT DOCUMENTS

| | | | | |
|---|---|---|---|---|
| KR | 10-1117331 | | 3/2012 | |
| KR | 20140026150 A | * | 3/2014 | ......... G11C 16/3418 |
| KR | 10-2015-0015808 A | | 2/2015 | |
| KR | 20180064617 A | * | 6/2018 | .............. G11C 7/04 |
| KR | 10-1934892 | | 1/2019 | |
| WO | WO-2015005635 A1 | * | 1/2015 | ......... G11C 11/5628 |

* cited by examiner

FIG. 13A

| BLK_index | SS_Info. |
|---|---|
| BLK1 | MC_G1_1 |
| | ⋮ |
| | MC_Gm_1 |
| ⋮ | |
| BLKa | MC_G1_k |
| | ⋮ |
| | MC_Gn_k |

FIG. 13B

| BLK_index | SB_index | SS_Info. |
|---|---|---|
| BLK1 | SB_11 | MC_G1_11 |
| | | ⋮ |
| | | MC_Gf_11 |
| | ⋮ | |
| | SB_d1 | MC_G1_d1 |
| | | ⋮ |
| | | MC_Gg_d1 |
| ⋮ | | |
| BLKa | SB_1a | MC_G1_1a |
| | | ⋮ |
| | | MC_Gh_1a |
| | ⋮ | |
| | SB_ea | MC_G1_ea |
| | | ⋮ |
| | | MC_Gi_ea |

MEMORY CONTROLLERS FOR PERFORMING STATE SHAPING OPERATION, MEMORY SYSTEMS INCLUDING THE MEMORY CONTROLLERS, AND METHODS OF OPERATING THE SAME

CROSS-REFERENCE TO RELATED APPLICATION

This application claims the benefits of Korean Patent Application No. 10-2019-0094021, filed on Aug. 1, 2019, in the Korean Intellectual Property Office, the disclosure of which is incorporated herein in its entirety by reference.

BACKGROUND

Some example embodiments relate to a semiconductor memory, and more particularly, to a memory device for performing a state shaping operation, a memory controller, and a memory system including the memory device and the memory controller.

Recently, as semiconductor technology has developed, a multi-level cell (MLC) capable of storing a plurality of bits in one memory cell, a triple-level cell (TLC), and a quad-level cell (QLC) have been implemented. However, technology for implementing the above memory cells has inferior reliability as compared with that of a single-level cell (SLC), and there is a large variation in scattering according to memory cell characteristics. Thus, research for addressing the above issues has been conducted.

SUMMARY

Some example embodiments provide a memory device having improved reliability by performing a state shaping operation on data considering memory cell characteristics and programming converted data, a memory controller, and a memory system including the memory device and the memory controller.

According to an aspect of some example embodiments, there is provided a method of operating a memory controller, the method including performing a state shaping operation on received data based on state shaping information in response to a write request, the received data and the write request being received from a host, the state shaping information representing a memory cell characteristic corresponding to a memory cell group on which the received data is to be programmed, and the state shaping information being received from a memory device, and transmitting transformation data to the memory device, the transformation data being generated through the state shaping operation.

According to an aspect of some example embodiments, there is provided a memory controller including processing circuitry configured to perform a state shaping operation on received data based on state shaping information in response to a write request, the received data and the write request being received from a host, the state shaping information representing a memory cell characteristic corresponding to a memory cell group on which the received data is to be programmed, and the state shaping information being received from a memory device, and transmit transformation data to the memory device, the transformation data being generated through the state shaping operation.

According to an aspect of some example embodiments, there is provided a method of operating a memory system including a memory device and a memory controller, the method includes performing, by the memory controller, a first state shaping operation on first data based on a first memory cell characteristic of a first memory cell group of the memory device, and causing, by the memory controller, the memory device to program first transformation data in the first memory cell group by transmitting the first transformation data to the memory device, the first transformation data being generated by the first state shaping operation.

According to an aspect of some example embodiments, there is provided a memory system including a memory device including a first memory cell group; and a memory controller configured to cause the memory device to program first transformation data in the first memory cell group by transmitting the first transformation data to the memory device, the first transformation data being generated by performing a state shaping operation on first data based on a first memory cell characteristic of the first memory cell group, in which the first data is to be programmed.

BRIEF DESCRIPTION OF THE DRAWINGS

Some example embodiments will be more clearly understood from the following detailed description taken in conjunction with the accompanying drawings in which:

FIGS. 13A and 13B are diagrams illustrating state shaping information according to some example embodiments;

DETAILED DESCRIPTION

Hereinafter, some example embodiments will be described in detail with reference to accompanying drawings. According to some example embodiments, each module described below may be implemented by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. For example, a module described below may be a hardware block including an analog circuit and/or a digital circuit, or a software block including a plurality of instructions executed by a processor (e.g., a control logic of a memory controller and a memory device).

Figure 1:
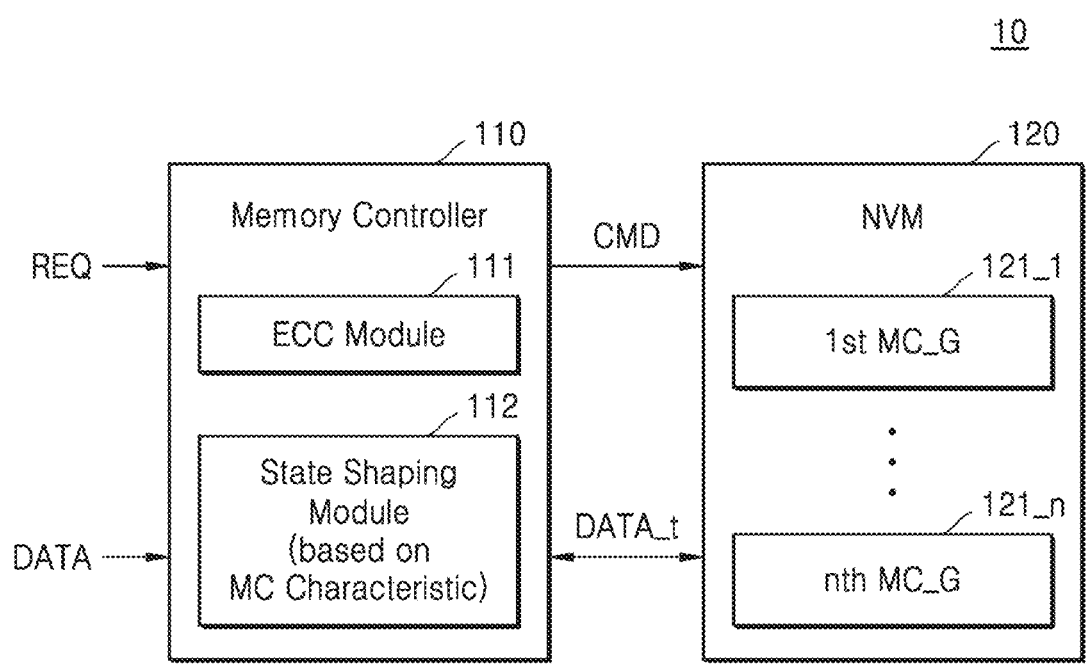
FIG. 1 is a block diagram of a memory system according to some example embodiments.

FIG. 1 is a block diagram of a memory system 10 according to some example embodiments.

Referring to FIG. 1, the memory system 10 may include a memory controller 110 and/or a memory device 120. In some example embodiments, the memory device 120 may include a non-volatile memory, e.g., a NAND flash memory device. However, some example embodiments are not limited thereto, that is, some example embodiments may be applied to a non-volatile memory such as phase-change random access memory (PRAM), resistive RAM (RRAM), magnetic RAM (MRAM), etc. An example of the memory cell array included in the memory device 120 will be described later with reference to FIGS. 9A to 9C. The memory controller 110 may receive a read/write request REQ and data DATA from an external device (e.g., a host, an application processor (AP), etc.) The memory controller 110 may transmit a command CMD to the memory device 120 in response to the read/write request REQ. The memory controller 110 may transmit transformation data DATA_t in response to the read/write request REQ or may receive convert transformation data DATA_t from the memory device 120.

The memory device 120 may include a plurality of memory cell groups 121_1 to 121_n having different memory cell characteristics. Each of the memory cell groups 121_1 to 121_n may include memory cells having the same or similar memory cell characteristics, and a plurality of bits may be stored in each of the memory cells. In some example embodiments, the memory cell characteristic (as referred to herein, the "memory cell characteristic" may also be referred to as "memory cell characteristics," and may refer to a single characteristic or several characteristics) may include at least one of a memory cell speed characteristic related to a programming speed of the memory cell and a memory cell retention characteristic related to a data retention duration of the memory cell. However, some example embodiments are not limited thereto, that is, the memory cell characteristic may include other various kinds of characteristics. According to some example embodiments, the memory cell characteristic may include a number of programming cycles performed by the memory cell and/or a degree of retention deterioration of the memory cell. In some example embodiments, when the memory device 120 includes a three-dimensional memory device including memory cells stacked vertically, the memory cell groups 121_1 to 121_n shown in FIG. 1 may be included in one memory block or the memory cell groups 121_1 to 121_n may be included in one sub-block of the memory block. Some example embodiments regarding this will be described below with reference to FIGS. 9A to 12. In some example embodiments, the memory device 120 may group a plurality of memory cells as the plurality of memory cell groups 121_1 to 121_n according to memory cell characteristics.

The memory controller 110 may include an error correction code (ECC) module 111 and/or a state shaping module 112. The ECC module 111 may generate error correction codes for detecting and correcting errors of the transformation data DATA_t stored in the memory device 120. According to some example embodiments, operations described herein as being performed by the memory system 10, the memory controller 110, the ECC module 111, the state shaping module 112 and/or the memory device 120 may be performed by processing circuitry The state shaping module 112 according to some example embodiments may perform a state shaping operation on data DATA based on a memory cell characteristic of a predetermined or determined memory cell group on which the data DATA is to be programmed. A state shaping operation may be defined as an operation of reducing the number of programming operations of the data DATA having a predetermined or determined value on the memory device 120, by transforming the data DATA having the predetermined or determined value corresponding to a programming state that may badly affect the data reliability so that the data DATA may have a different value. In detail, the state shaping operation may be defined as a series of operations of transforming the data DATA_to generate transformation data DATA_t so that the data DATA is suitable for a programming policy that is determined based on the memory cell characteristic of the memory cell group. The programming policy includes information about the number of target programming states of which the number of memory cells is reduced from among a plurality of programming states according to the memory cell characteristic of the memory cell group, and moreover, may further include information about the number of memory cells, which corresponds to each of the programming states. In some example embodiments, the state shaping module 112 may determine a programming policy with respect to each of the plurality of memory cell groups 121_1 to 121_n of the memory device 120, and accordingly, different programming policies may be respectively applied to the memory cell groups 121_1 to 121_n. As a result, each of the memory cell groups 121_1 to 121_n may have a target distribution different from those of the other memory cell groups, with respect to the plurality of programming states. The target distributions that are to be formed in the memory cell groups 121_1 to 121_n through the state shaping operation will be described in detail later with reference to FIGS. 5A to 7.

The memory device 120 according to some example embodiments may generate state shaping information representing the memory cell characteristic of each of the plurality of memory cell groups 121_1 to 121_n. As an example, the memory device 120 may generate the state shaping information by performing a predetermined or determined test operation on the memory cell groups 121_1 to 121_n, before performing a memory operation by receiving a command CMD from the memory controller 110. According to some example embodiments, the test may include performing a test program operation on the memory cell groups 121_1 to 121_n and identifying the memory cell characteristic of each of the plurality of memory cell groups 121_1 to 121_n based on analysis of the test program operation.

The memory device 120 may transmit the state shaping information to the memory controller 110, and the state shaping module 112 may perform the state shaping operation on the data DATA based on the state shaping information. Also, the memory device 120 may monitor a variation in the memory cell characteristic in each of the plurality of memory cell groups 121_1 to 121_n and may update the state shaping information based on a monitoring result. The memory device 120 may transmit the updated state shaping information to the memory controller 110, and the state shaping module 112 may perform the state shaping operation on the data DATA based on the updated state shaping information. Some example embodiments regarding this will be described below with reference to FIGS. 14 to 17.

The memory device 120 may receive the command CMD from the memory controller 110 and may perform an operation corresponding to the command CMD. For example, when the command CMD is a read command, the memory device 120 may transmit the transformation data DATA_t stored therein to the memory controller 110. When the command CMD is a program command, the memory device 120 may program the transformation data DATA_t.

The memory controller 110 according to some example embodiments may improve the data reliability of the memory device 120 by performing the state shaping operation on the data DATA based on a programming policy that is suitable for the memory cell characteristic of each of the plurality of memory cell groups 121_1 to 121_n in the memory device 120.

Figure 2:
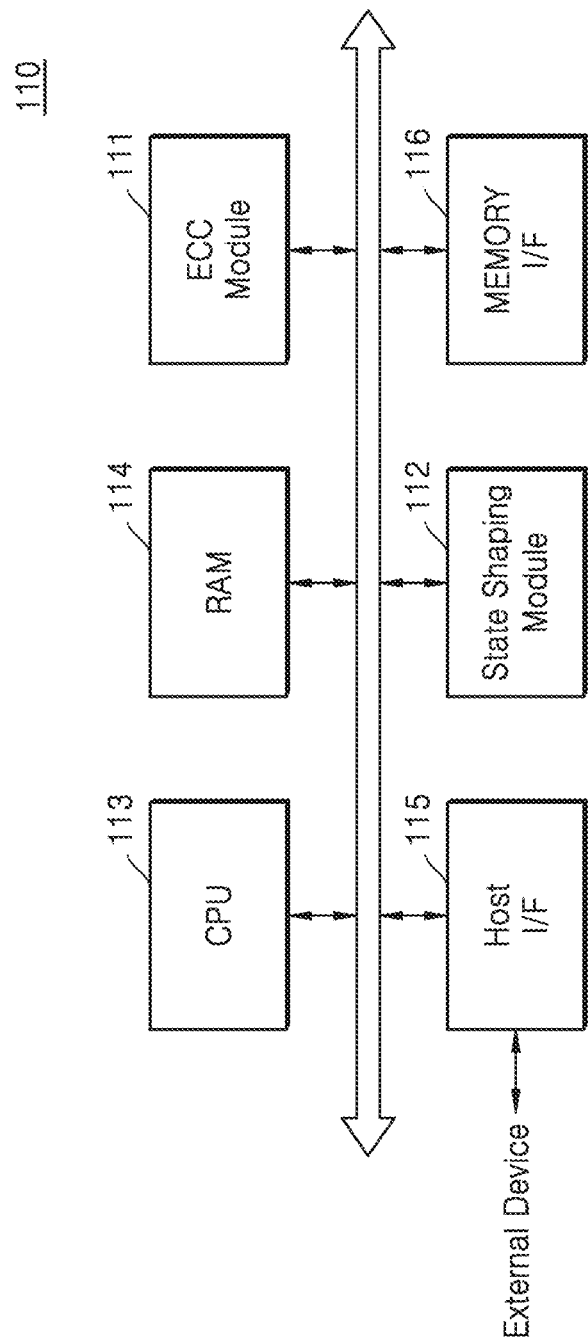
FIG. 2 is a block diagram showing an example of a memory controller shown in FIG. 1.

FIG. 2 is a block diagram showing an example of the memory controller 110 shown in FIG. 1.

Referring to FIG. 2, the memory controller 110 may include the ECC module 111, the state shaping module 112, processing circuitry 113 (e.g., a central processing unit (CPU)), a RAM 114, a host interface 115, and/or a memory interface 116.

The ECC module 111 may perform an ECC operation to generate an ECC corresponding to data transmitted from an external device. Also, the ECC module 111 may perform the ECC operation to generate an ECC corresponding to data that is state shaped by the state shaping module 112. The ECC module 111 may detect and correct errors of data read from the memory device 120 based on the ECC.

The state shaping module 112 may perform the state shaping operation on the data based on the memory cell characteristic of a predetermined or determined memory cell group to which the data is to be programmed. That is, the memory cell group includes memory cells, to which a plurality of bits may be programmed, and the memory cells may degrade due to stress caused by repeated programming operations as the memory cell becomes higher programming state, which may degrade data reliability of the memory device. In particular, the degradation may worsen or may reduce according to the memory cell characteristic of the memory cell group, and thus the state shaping module 112 may perform the state shaping operation suitable for the memory cell characteristic of the memory cell group. For example, when memory cells with slow cell characteristics are programmed to have a higher program state, this may put stress on other memory cells to which a high program voltage is applied until the higher program state is reached. Such stress may be fatal or harmful for memory cells with weaker characteristics (e.g., fast cells).

The state shaping module 112 may determine a programming policy suitable for the characteristic of the memory cell group of the memory device, on which the data is to be programmed, and may perform the state shaping operation on the data according to the programming policy to generate transformation data. Through the state shaping operation of the state shaping module 112, from among the plurality of programming states formed in the memory cell groups, the number of memory cells in some programming states that may badly affect the data reliability is restricted under a threshold value, and thus the data reliability of the data device may be improved.

The processing circuitry 113 may control overall operations of the memory controller 110. The RAM 114 may operate as a buffer memory for compensating for a difference between speeds of the external device and the memory device. Also, the RAM 114 may be used as an operation memory of the processing circuitry 113. The host interface 115 may provide a transfer channel between the external device and the memory controller 110. The memory interface 116 may provide a transfer channel between the memory controller 110 and the memory device.

Figure 3:
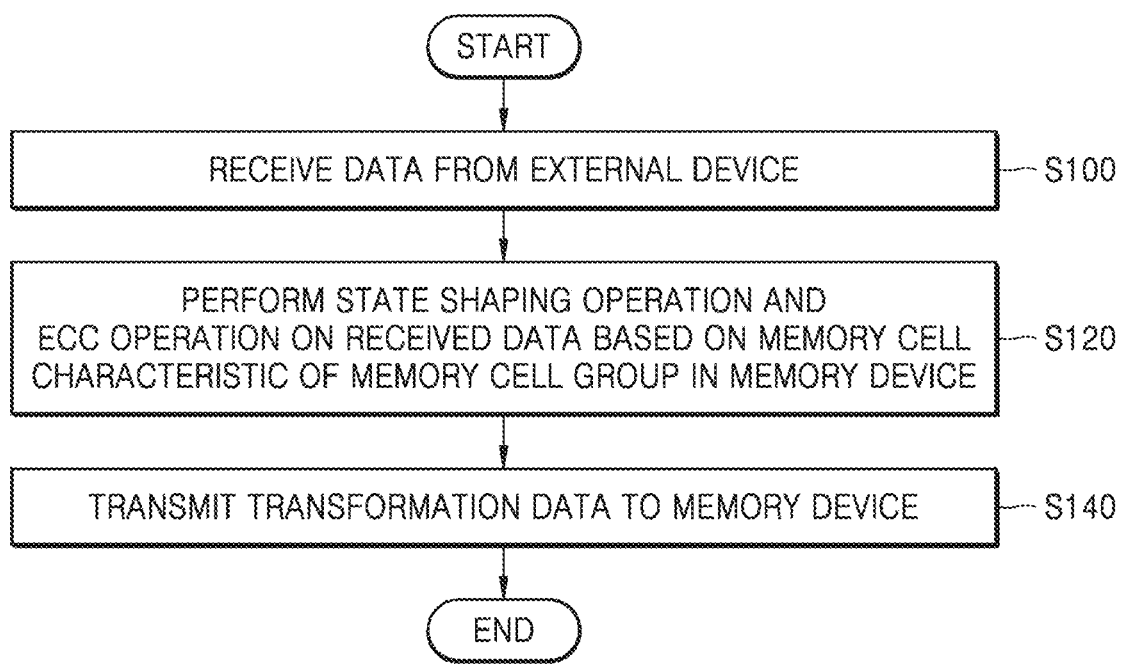
FIG. 3 is a flowchart illustrating operations of a memory controller according to some example embodiments.

FIG. 3 is a flowchart illustrating operations of the memory controller 110 according to some example embodiments.

Referring to FIG. 1 and FIG. 3, in operation S100, the memory controller 110 may receive data DATA from an external device. In operation S120, the memory controller 110 may perform a state shaping operation and/or an ECC operation on the received data based on the memory cell characteristic of the memory cell group in the memory device, in which the received data is to be stored. For example, the memory controller 110 may perform the state shaping operation on the data DATA and/or may generate parity bits of an ECC of the state-shaped data. The memory controller 110 may generate transformation data DATA_t through operations of the state shaping module 112 and/or the ECC module 111.

In operation S140, the memory controller 110 may transfer the transformation data DATA_t to the memory device 120. The memory device 120 may program the transformation data DATA_t on the memory cell group.

According to the method of operating the memory controller 110 illustrated with reference to FIG. 3, the data reliability of the memory device may be improved.

Figure 4A:
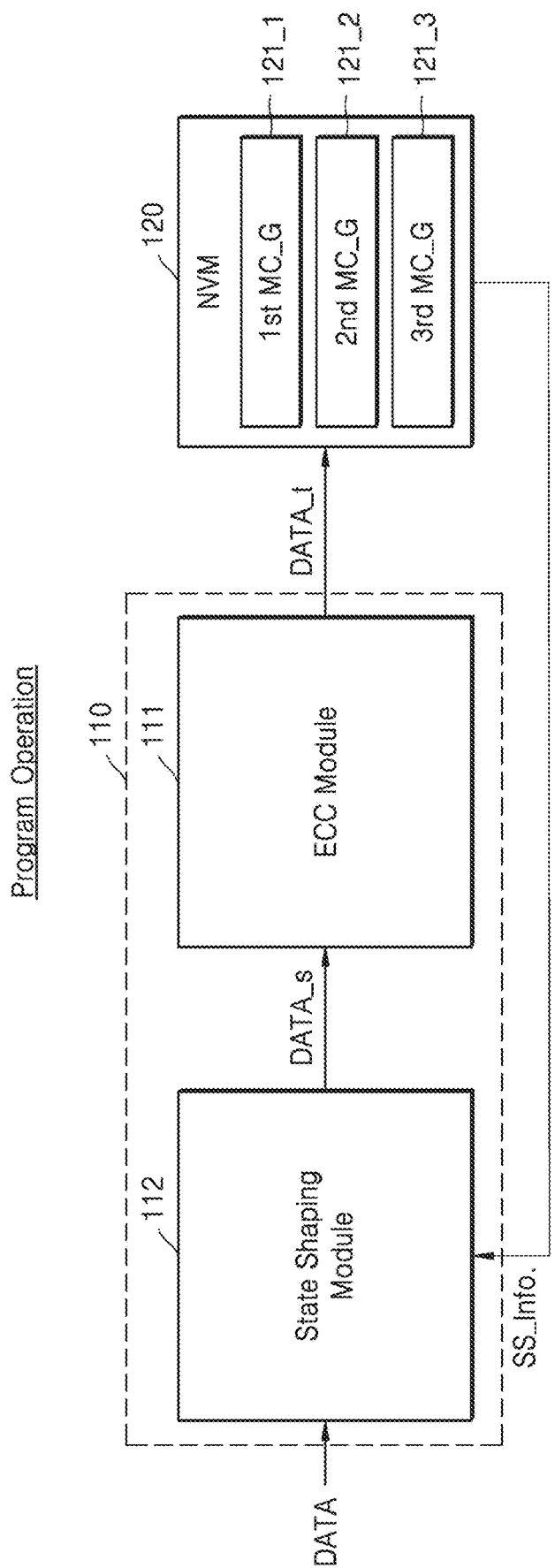
FIGS. 4A and 4B are block diagrams illustrating operations of a memory controller according to some example embodiments.
Figure 4B:
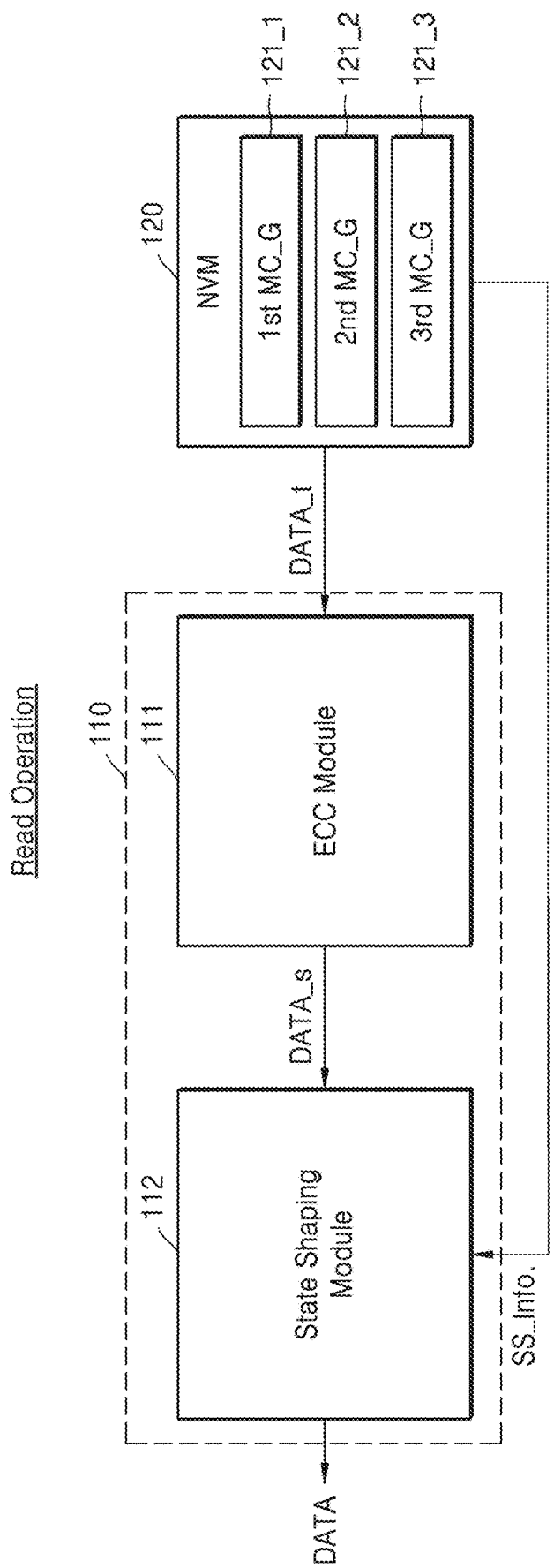

FIGS. 4A and 4B are block diagrams illustrating operations of the memory controller 110 according to some example embodiments. For example, FIG. 4A illustrates a programming operation on the memory device 120 and FIG. 4B illustrates a reading operation on the memory device 120. For convenience of description, elements that are not specific to the operations of the memory controller 110 depicted in FIGS. 4A and 4B are omitted here.

Referring to FIG. 4A, the memory controller 110 may receive the data DATA from outside and the state shaping module 112 may perform a state shaping operation on the data DATA. At this time, the memory device 120 may generate state shaping information SS_Info. representing the memory cell characteristic of the memory cell group in which the data DATA is to be stored from among first to third memory cell groups 121_1 to 121_3. The state shaping module 112 may perform the state shaping operation on the data DATA based on the state shaping information SS_Info. received from the memory device 120 to generate state-shaped data DATA_s. In some example embodiments, the state shaping information SS_Info. may be stored in a memory (not shown) of the memory controller 110 and the state shaping module 112 may use the state shaping information SS_Info. via the memory (not shown) when performing the state shaping operation. A detailed example of the state shaping operation of the state shaping module 112 will be described below with reference to FIGS. 5A to 7. After the state-shaped data DATA_s is generated, the ECC module 111 may perform an ECC operation on the state-shaped data DATA_s to generate transformation data DATA_t. For example, the transformation data DATA_t may include the state-shaped data DATA_s and/or an ECC. The memory controller 110 may generate the transformation data DATA_t from the received data DATA and transmit the transformation data DATA_t to the memory device 120 through the above-mentioned operations. The memory device 120 may program the transformation data DATA_t on the memory cell group corresponding to the transformation data DATA_t, from among the plurality of memory cell groups 121_1 to 121_3. However, some example embodiments are not limited thereto, that is, the state shaping module 112 may skip the ECC operation on the state-shaped data DATA_s and transmit the state-shaped data DATA_s to the memory device 120, and the memory device 120 may program the state-shaped data DATA_s on the memory cell group corresponding to the state-shaped data DATA_s from among the plurality of memory cell groups 121_1 to 121_3.

Referring to FIG. 4B, the memory controller 110 may receive the transformation data DATA_t that is programmed on the memory device 120. The ECC module 111 may detect and correct an error from the transformation data DATA_t to generate the state-shaped data DATA_s. The state shaping module 112 may inversely transform the state-shaped data DATA_s to generate data DATA and then transmit the data DATA to outside (e.g., to an external device). However, some example embodiments are not limited thereto, that is, the memory controller 110 may directly receive the state-shaped data DATA_s that is programmed on the memory device 120. Here, the state shaping module 112 may inversely transform the state-shaped data DATA_s to generate data DATA and then transmit the data DATA to outside.

FIGS. 5A to 7 are diagrams illustrating a target distribution that may be formed in a memory device as a result of a state shaping operation performed by the memory controller according to some example embodiments. FIGS. 5A to 7 will be described with reference to FIG. 4A. FIGS. 5A to 7 are provided for a restricted case for convenience of comprehension and some example embodiments are not limited thereto, that is, some example embodiments may be applied to all cases that may be inferred from descriptions about FIGS. 5A to 7.

Referring to FIG. 4A, the memory device 120 may include first to third memory cell groups 121_1 to 121_3, and the memory cell characteristics of the first to third memory cell groups 121_1 to 121_3 may be different from one another. That is, the memory cell speeds may be fast in an order of the third memory cell group 121_3, the second memory cell group 121_2, and the first memory cell 121_1, and the memory cell retention periods may be short in an order of the third memory cell group 121_3, the second memory cell group 121_2, and the first memory cell group 121_1. Also, it is assumed that the memory cell of the memory device 120 is a triple-level cell. The memory cell speed refers to a degree to which a threshold voltage distribution is shifted when a predetermined or determined programming voltage is applied to the memory cell and may correspond to one of the memory cell characteristics. Even when the same programming voltage or a similar programming voltage is applied to the memory cells, the degrees to which the threshold voltage distribution is shifted in the memory cells may be different from one another. In addition, as the memory cell has a fast memory cell speed, the degree to which the threshold voltage distribution is shifted may be increased.

Figure 5A:
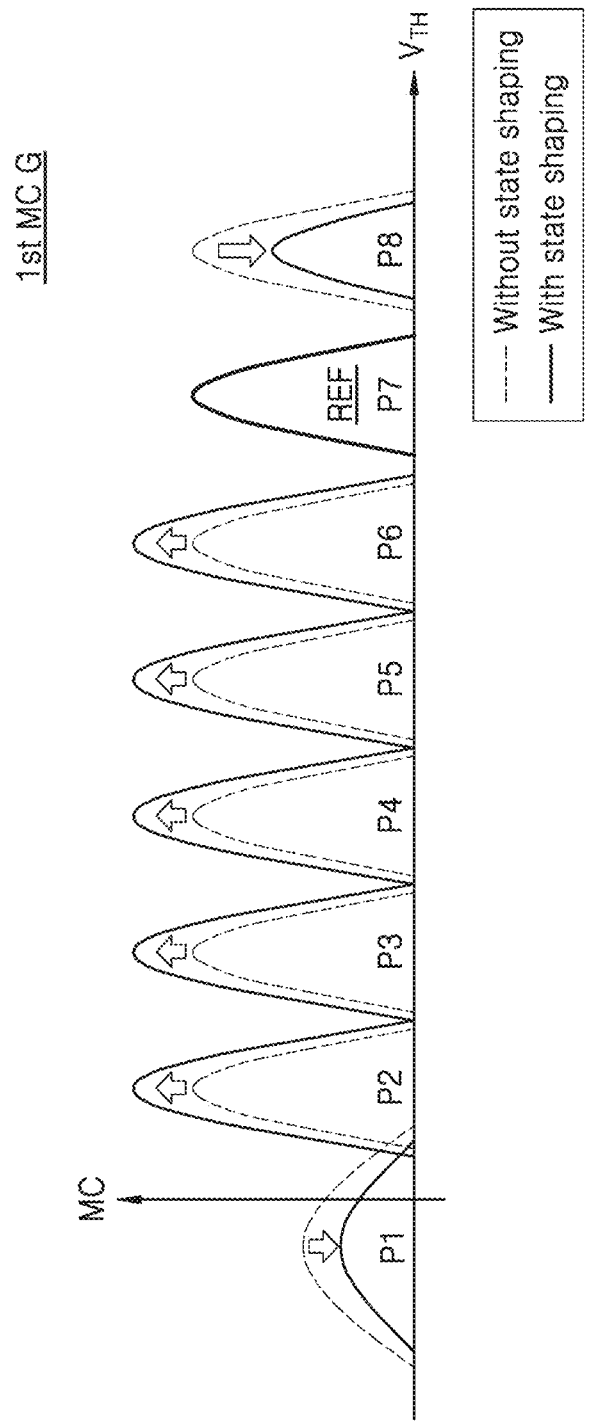
FIGS. 5A to 7 are diagrams illustrating a target distribution that may be formed in a memory device as a result of a state shaping operation performed by the memory controller according to some example embodiments.

Referring to FIG. 5A, the state shaping module 112 may determine programming policies (as used herein, "programming polices" may refer to one or more programming policies) about the number of memory cells corresponding to each of first to eighth programming states P1 to P8 that may be formed by the first memory cell group 121_1, based on the memory cell characteristic of the first memory cell group 121_1. That is, the state shaping module 112 may determine a first target distribution with respect to the first memory cell group 121_1 and may perform the state shaping operation on the data to be programmed on the first memory cell group 121_1 based on the first target distribution. According to some example embodiments, the state shaping module 112 may determine the first target distribution based on the memory cell characteristic of the first memory cell group 121_1. For example, the state shaping module 112 may determine the first target distribution by referring to a database storing target distributions in association with corresponding memory cell characteristics, and determining the first target distribution as the target distribution associated with the memory cell characteristic of the first memory cell group 121_1. According to some example embodiments, the data to be programmed on the first memory cell group 121_1 indicates the number of memory cells corresponding to each of first to eighth programming states P1 to P8 that may be formed by the first memory cell group 121_1 (may also be referred to herein as an "initial distribution"). According to some example embodiments, performing the state shaping operation based on the first target distribution includes transforming the data to be programmed on the first memory cell group 121_1 such that the number of memory cells corresponding to each programming state is consistent with the first target distribution. In the drawings, dashed lines denote target distribution without performing the state shaping operation and solid lines denote target distribution of a result after performing the state shaping operation. Also, the X axis denotes a threshold voltage VTH (may also be referred to as a "level" herein) and the Y axis denotes the number of memory cells (MC). In detail, as shown in FIG. 5A, the state shaping module 112 may determine the seventh programming state P7 as a reference programming state REF and may reduce the number of memory cells corresponding to the eighth programming state P8 that is a higher level than the seventh programming state P7 (e.g., such that the number of memory cells corresponding to eighth programming state P8 is consistent with the first target distribution). That is, the state shaping module 112 may perform the state shaping operation on a plurality of pieces of data programmed on the first memory cell group 121_1, so that the number of pieces of data having a value corresponding to the eighth programming state P8 may be restricted. According to some example embodiments, first target distribution indicates the reference programming state REF. According to some example embodiments, the state shaping module 112 may determine the reference programming state REF by referring to a database storing reference programming states in association with corresponding memory cell characteristics, and determining the reference programming state REF as the reference programming state associated with the memory cell characteristic of the first memory cell group 121_1. Hereinafter, the programming state of a higher level than that of the reference programming state REF may be referred to as a target programming state. Moreover, the state shaping module 112 may reduce the number of memory cells corresponding to the first programming state P1. The state shaping module 112 may reduce the number of memory cells corresponding to the eighth programming state P8 and the first programming state P1, and may evenly increase the number of memory cells corresponding to each of second to sixth programming states P2 to P6 (e.g., such that the number of memory cells corresponding to each programming state is consistent with the first target distribution).

The state shaping module 112 according to some example embodiments may perform the state shaping operation so that data having a value (e.g., '000' or '111') corresponding to the first programming state P1 or the eighth programming state P8 may have a value corresponding to one of the second to sixth programming states P2 to P6 and the first target distribution may be satisfied (e.g., such that the number of memory cells corresponding to each programming state is consistent with the first target distribution). According to some example embodiments, performing the state shaping operation includes transforming a value of the data to be programmed on the first memory cell group 121_1 (also referred to herein as an "initial value") to have a different value (also referred to herein as a "transformed value") corresponding to a programming state at a lower level than the reference programming state REF.

Figure 5B:
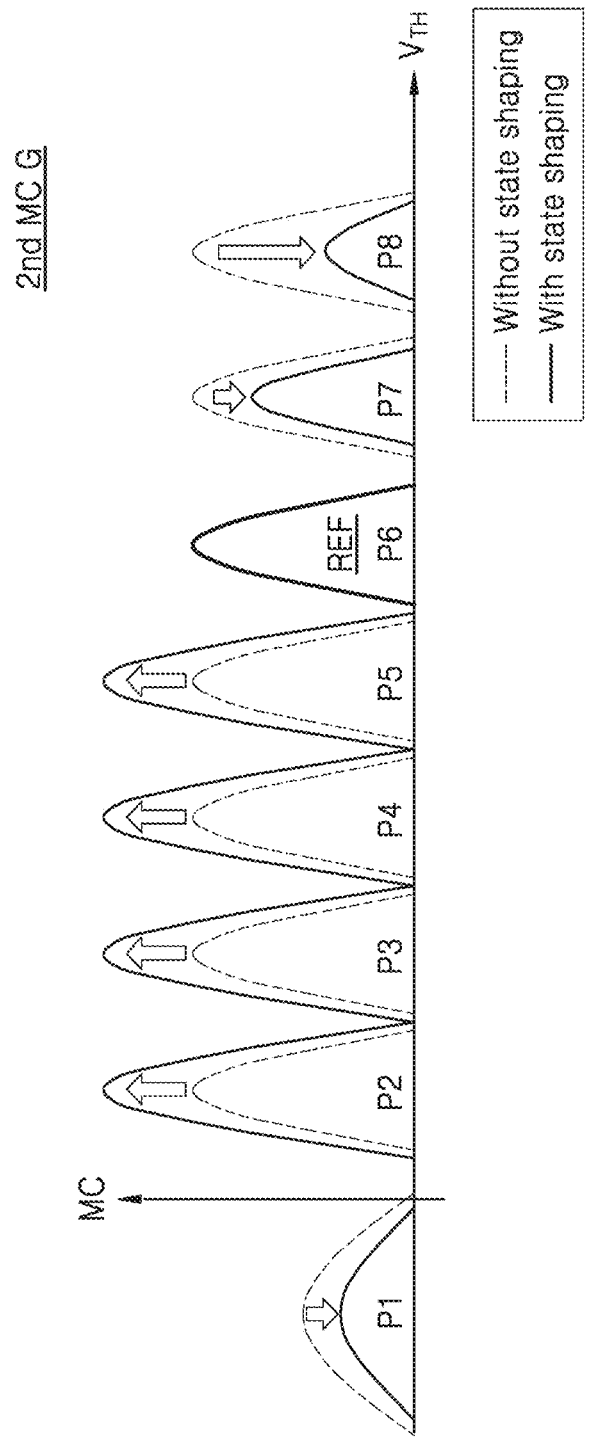

Referring to FIG. 5B, the state shaping module 112 may determine a programming policy about the number of memory cells corresponding to each of first to eighth programming states P1 to P8 that may be formed by the second memory cell group 121_2, based on the memory cell characteristic of the second memory cell group 121_2. That is, the state shaping module 112 may determine a second target distribution with respect to the second memory cell group 121_2 and may perform the state shaping operation on the data to be programmed on the second memory cell group 121_2 based on the second target distribution. In detail, as shown in FIG. 5B, the state shaping module 112 may determine the sixth programming state P6 as a reference programming state REF and may reduce the number of memory cells corresponding to the seventh and eighth programming states P7 and P8 that are higher level than the sixth programming state P6. That is, the state shaping module 112 may perform the state shaping operation on a plurality of pieces of data programmed on the second memory cell group 121_2, so that the number of pieces of data having a value corresponding to the seventh and eighth programming states P7 and P8 may be restricted. In some example embodiments, the state shaping module 112 may increase a degree of downward adjusting of (e.g., may further reduce) the number of memory cells as the level increases higher, with respect to seventh and eighth programming states P7 and P8 (e.g., such that the number of memory cells corresponding to each programming state is consistent with the second target distribution). In other words, the state shaping module 112 may differentiate the degrees of reduction, so that the number of memory cells corresponding to the seventh programming state P7 is greater than the number of memory cells corresponding to the eighth programming state P8. The state shaping module 112 may reduce the number of memory cells corresponding to the seventh programming state P7, the eighth programming state P8, and the first programming state P1, and may evenly increase the number of memory cells corresponding to each of second to fifth programming states P2 to P5 (e.g., such that the number of memory cells corresponding to each programming state is consistent with the second target distribution).

The state shaping module 112 according to some example embodiments may perform the state shaping operation on data, so that the data having a value (e.g., '000', '110', or '111') corresponding to the first programming state P1, the seventh programming state P7, or the eighth programming state P8 may have a value corresponding to one of the second to fifth programming states P2 to P5 and the second target distribution may be satisfied.

Figure 5C:
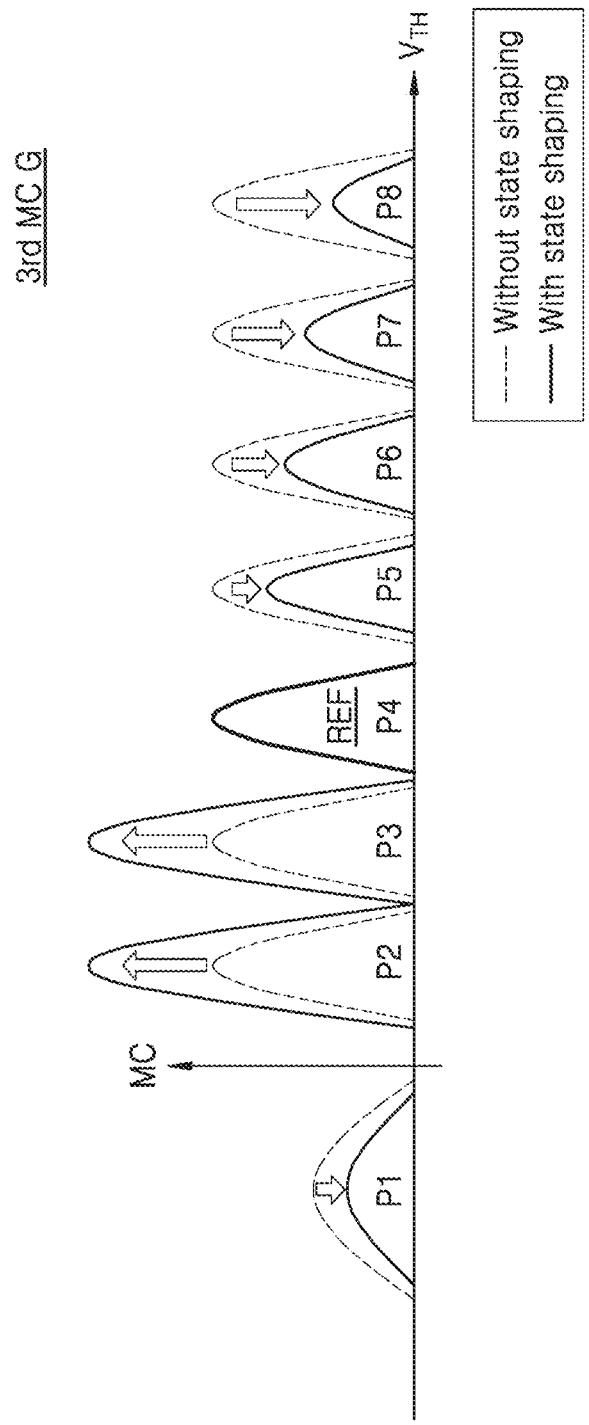

Referring to FIG. 5C, the state shaping module 112 may determine a programming policy about the number of memory cells corresponding to each of a plurality of programming states P1 to P8 that may be formed by the third memory cell group 121_3, based on the memory cell characteristic of the third memory cell group 121_3. That is, the state shaping module 112 may determine a third target distribution with respect to the third memory cell group 121_3 and may perform the state shaping operation on the data to be programmed on the third memory cell group 121_3 based on the third target distribution. In detail, as shown in FIG. 5C, the state shaping module 112 may determine the fourth programming state P4 as a reference programming state REF and may reduce the number of memory cells corresponding to the fifth to eighth programming states P5 to P8 that are higher level than the fourth programming state P4. That is, the state shaping module 112 may perform the state shaping operation on a plurality of pieces of data programmed on the third memory cell group 121_3, so that the number of pieces of data having a value corresponding to the fifth to eighth programming states P5 to P8 may be restricted. In some example embodiments, the state shaping module 112 may increase a degree of downward adjusting of the number of memory cells as the level increases higher, with respect to fifth to eighth programming states P5 to P8 (e.g., such that the number of memory cells corresponding to each programming state is consistent with the third target distribution). The state shaping module 112 may reduce the number of memory cells corresponding to the fifth to eighth programming states P5 to P8 and the first programming state P1, and may evenly increase the number of memory cells corresponding to each of second and third programming states P2 to P3 (e.g., such that the number of memory cells corresponding to each programming state is consistent with the third target distribution).

The state shaping module 112 according to some example embodiments may perform the state shaping operation on data, so that the data having a value corresponding to one of the first programming state P1 and the fifth to eighth programming states P5 to P8 may have a value corresponding to one of the second to third programming states P2 to P3 and the third target distribution may be satisfied.

Regarding differences among the first to third target distributions shown in FIGS. 5A to 5C, the degree of downward adjustment of the number of memory cells in a target programming state (e.g., the eighth programming state P8) in the first target distribution may be different from the degree of downward adjustment of the number of memory cells in a target programming state (e.g., the eighth programming state P8) in the second target distribution and the degree of downward adjustment of the number of memory cells in a target programming state (e.g., the eight programming state P8) in the third target distribution. Also, the degree of downward adjustment of the number of memory cells in a target programming state (e.g., the seventh programming state P7) in the second target distribution may be different from the degree of downward adjustment of the number of memory cells in a target programming state (e.g., the seventh programming state P7) in the third target distribution.

In summary, considering the memory cell characteristics of the first to third memory cell groups 121_1 to 121_3, a degradation degree of the third memory cell group 121_3 is greater than those of other first and second memory cell groups 121_1 and 121_2 due to the stress caused by the repeated programming operations, and thus, the number of target programming states that are the target of downward adjustment of the number of memory cells in the third memory cell group 121_3 is greater than those of the other memory cell groups, that is, the first and second memory cell groups 121_1 and 121_2. Accordingly, the number of target programming states that are the targets of downward adjustment of the number of memory cells is greater than those of the first and second memory cell groups 121_1 and 121_2, and the degree of downward adjustment of the number of memory cells in the target programming states is increased to improve the data reliability of the third memory cell group 121_3.

Figure 6A:
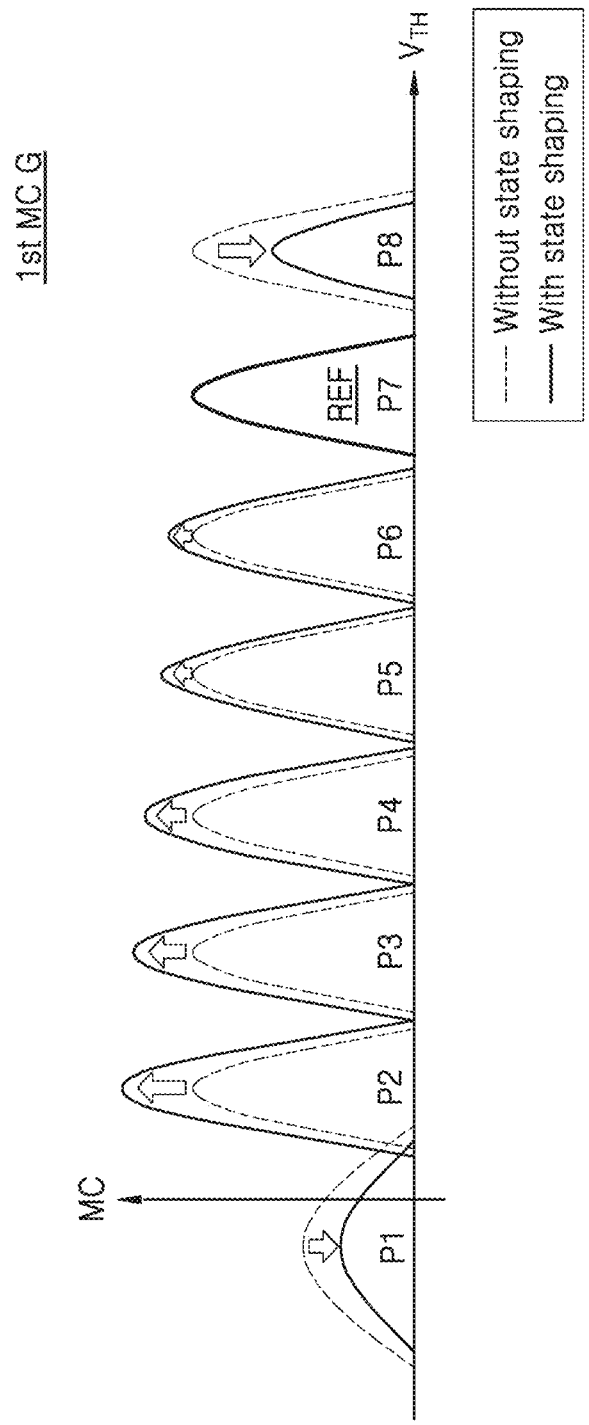
Figure 6B:
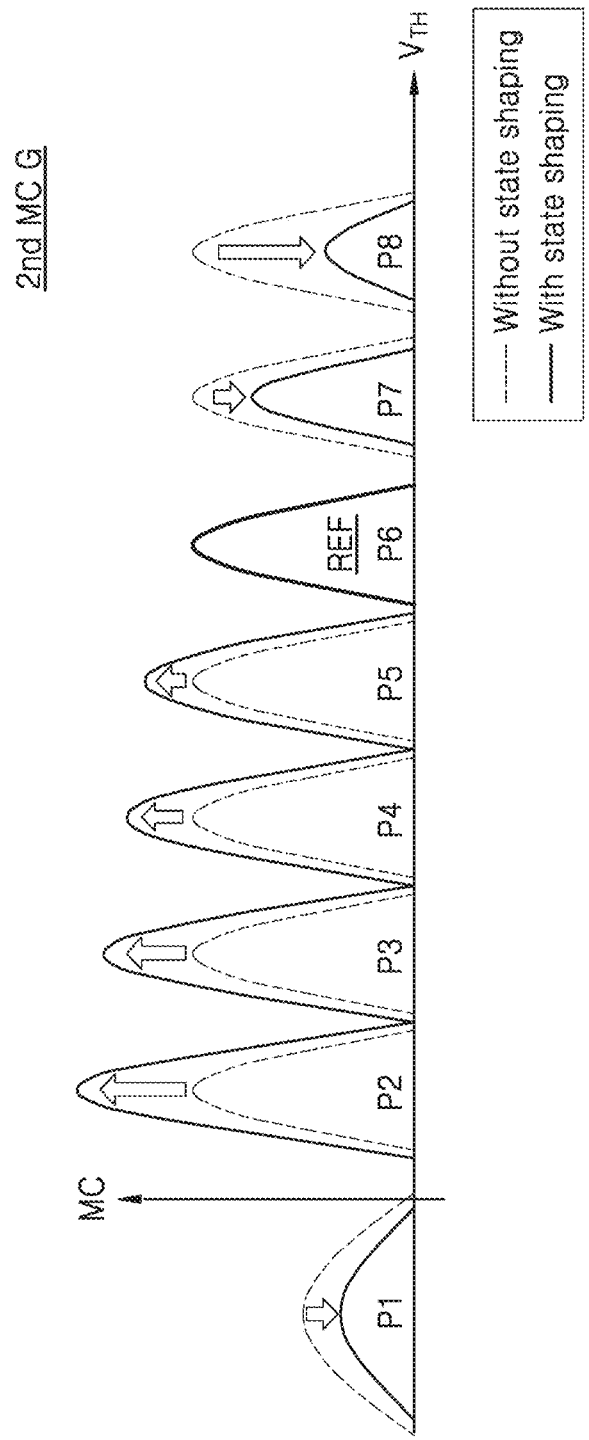
Figure 6C:
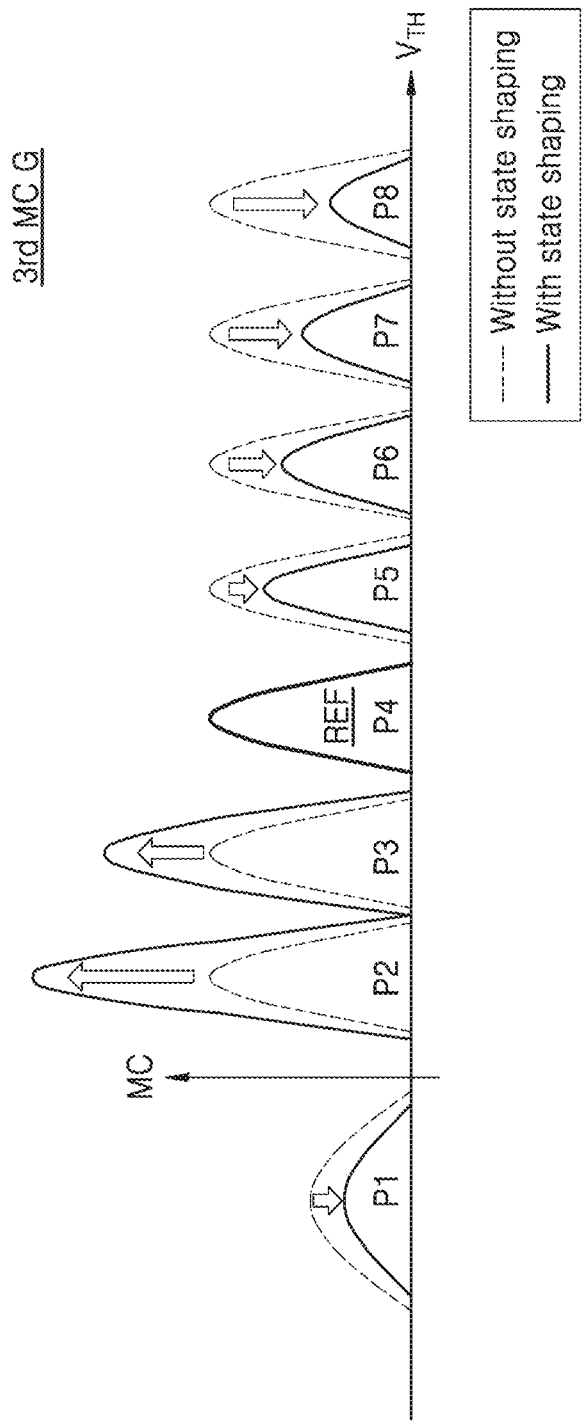

FIGS. 6A to 6C are graphs illustrating examples of upward adjustment of the number of memory cells corresponding to other programming states than the target programming state in the target distribution, wherein the examples are different from those shown in FIGS. 5A to 5C.

Referring to FIG. 6A, the state shaping module 112 according to some example embodiments may reduce the number of memory cells corresponding to the eighth programming state P8 and the first programming state P1, and may unevenly increase (upward adjustment) the number of memory cells corresponding to each of the other programming states (second to sixth programming states P2 to P6) (e.g., such that the number of memory cells corresponding to each programming state is consistent with the first target distribution). In detail, the state shaping module 112 may increase a degree of upward adjustment of the number of memory cells as the level becomes lower, with respect to the other (second to sixth) programming states P2 to P6.

Referring to FIG. 6B, the state shaping module 112 according to some example embodiments may reduce the number of memory cells corresponding to the seventh programming state P7, the eighth programming state P8, and the first programming state P1, and may unevenly increase (upward adjustment) the number of memory cells corresponding to each of the other programming states (second to fifth programming states P2 to P5) (e.g., such that the number of memory cells corresponding to each programming state is consistent with the second target distribution). In detail, the state shaping module 112 may increase a degree of upward adjustment of the number of memory cells as the level becomes lower, with respect to the other (second to fifth) programming states P2 to P5.

Referring to FIG. 6C, the state shaping module 112 according to some example embodiments may reduce the number of memory cells corresponding to the fifth to eighth programming states P5 to P8 and the first programming state P1, and may unevenly increase (upward adjustment) the number of memory cells corresponding to each of the other programming states (second and third programming states P2 and P3) (e.g., such that the number of memory cells corresponding to each programming state is consistent with the third target distribution). In detail, the state shaping module 112 may increase a degree of upward adjustment of the number of memory cells as the level becomes lower, with respect to the other (second and third) programming states P2 and P3.

Memory cells degrade with use due to stress from programming operations. The degradation of different memory cells varies according to the characteristics of the memory cells including memory cell speed and/or retention, and these characteristics vary among word lines in some memory systems (e.g., VNAND memory systems). However, conventional memory controllers perform state shaping without consideration of the variance of these characteristics among word lines. Accordingly, conventional memory controllers implement programming policies in which an excessive number of memory cells correspond to unreliable programming states, thereby decreasing the reliability of conventional memory systems and increasing programming delay (e.g., due to repeated operations in response to programming errors).

Some example embodiments provide an improved memory controller that performs state shaping operations according to characteristics of memory cells to be programmed. For example, the improved memory controller implements programming policies that reduce a number of memory cells corresponding to the unreliable programming states. Accordingly, the improved memory controller overcomes the deficiencies of the conventional memory controllers to improve reliability and reduce programming delay.

Figure 7:
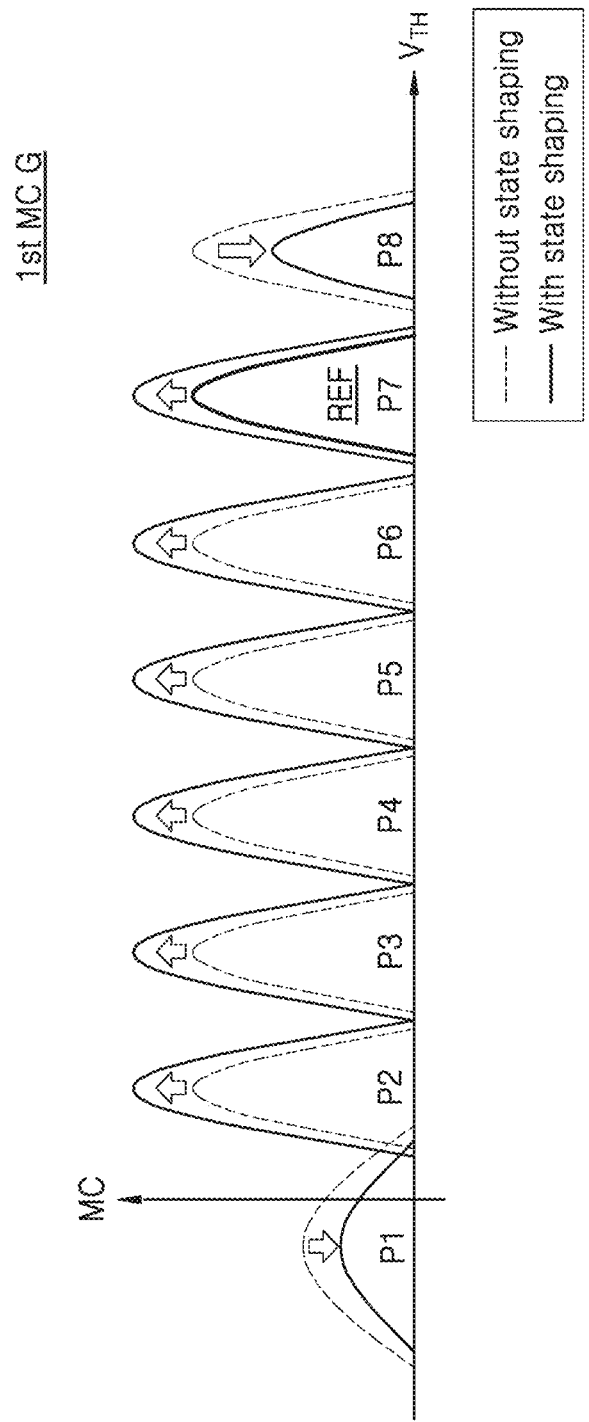

FIG. 7 illustrates another example different from the first target distribution of FIG. 5A. Referring to FIG. 7, the state shaping module 112 according to some example embodiments may reduce the number of memory cells corresponding to the eighth programming state P8 and the first programming state P1, and may evenly increase the number of memory cells corresponding to each of the other programming states (second to seventh programming states P2 to P7) (including the reference programming state REF unlike the example shown in FIG. 5A). That is, the reference programming state REF is determined in order to represent a boundary with the target programming state of the downward adjustment of the number of memory cells, and the number of memory cells corresponding to the reference programming state REF may be also increased.

Figure 8:
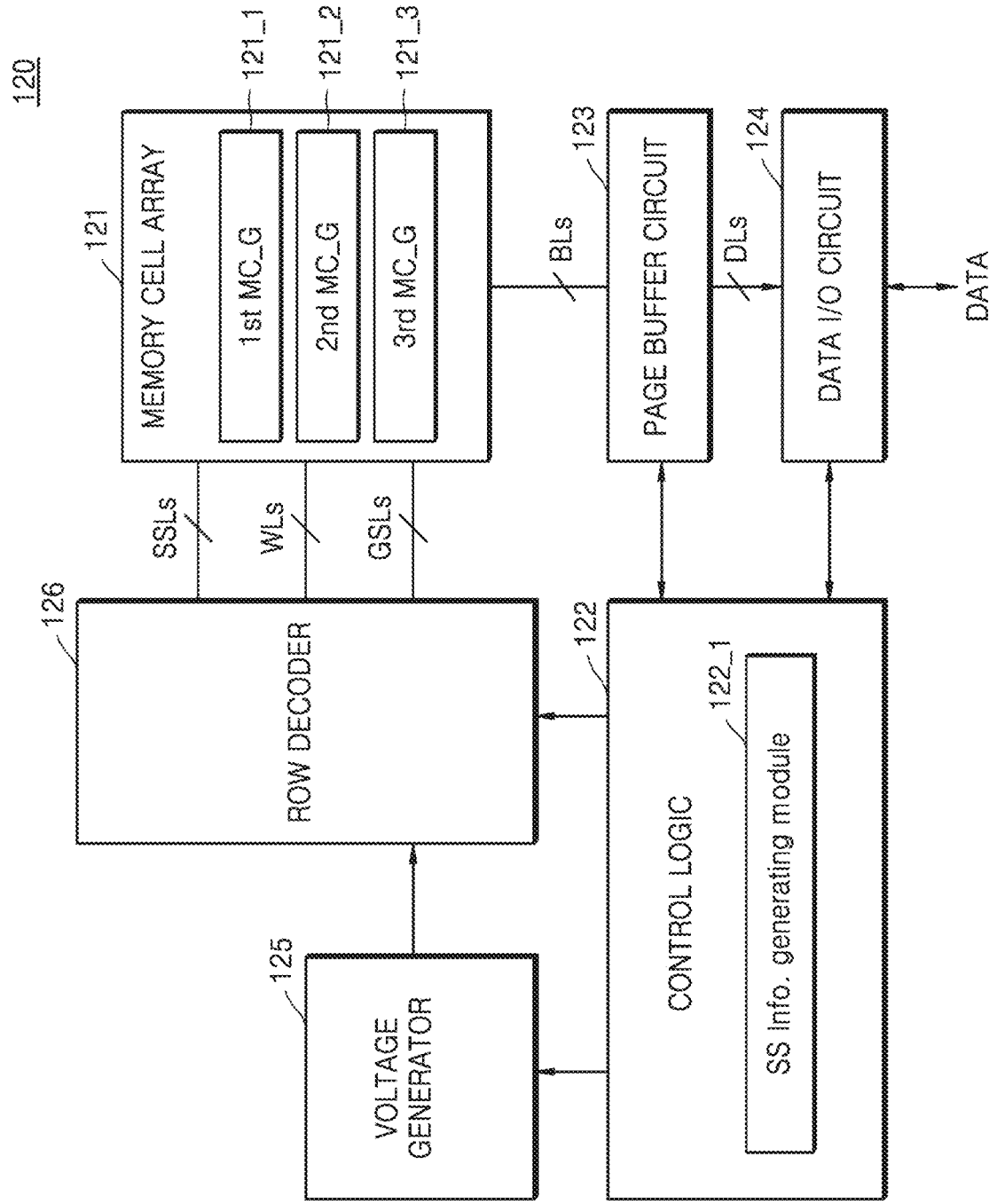
FIG. 8 is a block diagram of a memory device according to some example embodiments.

FIG. 8 is a block diagram of the memory device 120 according to some example embodiments.

Referring to FIG. 8, the memory device 120 may include a memory cell array 121, a control logic 122, a page buffer circuit 123, a data input/output circuit 124, a voltage generator 125, and/or a row decoder 126. The memory cell array 121 may be connected to the row decoder 126 via word lines WL and ground selection lines GSL and may be connected to the page buffer circuit 123 via bit lines BL.

The memory cell array 121 may include a plurality of NAND cell strings. Each of the cell strings may form a channel in a vertical or a horizontal direction. In the memory cell array 121, the plurality of word lines WL may be stacked in a vertical direction. Each of the word lines WL may configure a control gate of memory cells included in the cell string. In this case, the channel of the memory cell may be formed in the vertical direction. According to the arrangement of the memory cell array 121, each of the cell strings sharing one bit line BL may be independently selected. The cell strings that are independently selected may be connected to a plurality of ground selection lines GSL that are electrically separated from one another. The memory cell array 121 may include the first to third memory cell groups 121_1 to 121_3 having different memory cell characteristics from one another, as described above. In some example embodiments, the first to third memory cell groups 121_1 to 121_3 may be obtained by grouping the memory cells having the same or similar memory cell characteristics as a predetermined or determined result of a test performed by the control logic 122, and in some example embodiments, may be obtained by grouping the memory cells based on the word lines to which the memory cells are connected without performing an additional test. This will be described later with reference to FIG. 10, etc. Also, some example embodiments are not limited to the example shown in FIG. 8, and the memory cell array 121 may include more or less memory cell groups.

The row decoder 126 may select one of the word lines WL of the memory cell array 121 by decoding an address transmitted from the memory controller 110 (e.g., via the control logic 122 and/or the data input/output circuit 124). The row decoder 126 may provide a selected word line WL of the memory cell array 121 with a word line voltage provided from the voltage generator 125. For example, in a programming operation, the row decoder 126 may apply a program voltage to the selected word line WL and may apply a pass voltage to non-selected word lines WL. Also, the row decoder 126 may provide a selection voltage respectively to the string selection lines SSL and the ground selection lines GSL in various memory operations.

The page buffer circuit 123 may operate as a write driver or a sense amplifier according to an operation performed by the control logic 122. During the programming operation, the page buffer circuit 123 may provide the bit lines BL of the memory cell array 121 with a voltage corresponding to the data that is to be programmed in the bit lines BL. During a reading operation, the page buffer circuit 123 may sense the data stored in the memory cell that is selected as a target of the reading operation through the bit lines BL and may provide the data to the data input/output circuit 124.

The data input/output circuit 124 may be connected to the page buffer circuit 123 via data lines DL and may provide data DATA input therein to the page buffer circuit 123 or may output data DATA provided from the page buffer circuit 123 to outside (e.g., to the memory controller 110). Here, the data DATA may be the data transformed by the state shaping operation according to some example embodiments. The data input/output circuit 124 may provide an input address or an instruction to the control logic 122 and/or the row decoder 126.

The control logic 122 according to some example embodiments may include a state shaping information generation module 122_1. The state shaping information generation module 122_1 may generate state shaping information representing the memory cell characteristic of each of the first to third memory cell groups 121_1 to 121_3. In some example embodiments, the state shaping information may include data (or information) that may indicate a degree of characteristics by quantifying the memory cell characteristics of the first to third memory cell groups 121_1 to 121_3. In some example embodiments, the state shaping information may include location information (or address information) of the word lines corresponding to each of the first to third memory cell groups 121_1 to 121_3. That is, when the memory device 120 is a three-dimensional memory device, the location information of the word lines may be a reference for determining the memory cell characteristic of the memory cell group, and thus may be included in the state shaping information. However, some example embodiments are not limited to the above examples, and the state shaping information may be implemented variously provided that the memory cell characteristics of the first to third memory cell groups 121_1 to 121_3 may be notified to the memory controller.

Also, the state shaping information generation module 122_1 according to some example embodiments may generate the state shaping information in advance, before being connected to the memory controller 110 (see FIG. 1) and performing the memory operation (e.g., programming operation). For example, the state shaping information generation module 122_1 may group the memory cells according to the memory cell characteristics through a predetermined or determined test performed on the memory cell array 121 and may generate state shaping information corresponding to each of the first to third memory cell groups 121_1 to 121_3. According to some example embodiments, operations described herein as being performed by the control logic 122 and/or the state shaping information generation module 122_1 may be performed by processing circuitry. According to some example embodiments, the operations described herein as being performed by the memory cell array 121, the page buffer circuit 123, the data input/output circuit 124, the voltage generator 125, and/or the row decoder 126 may be performed under the control of the control logic 122 and/or by processing circuitry.

Figure 9A:
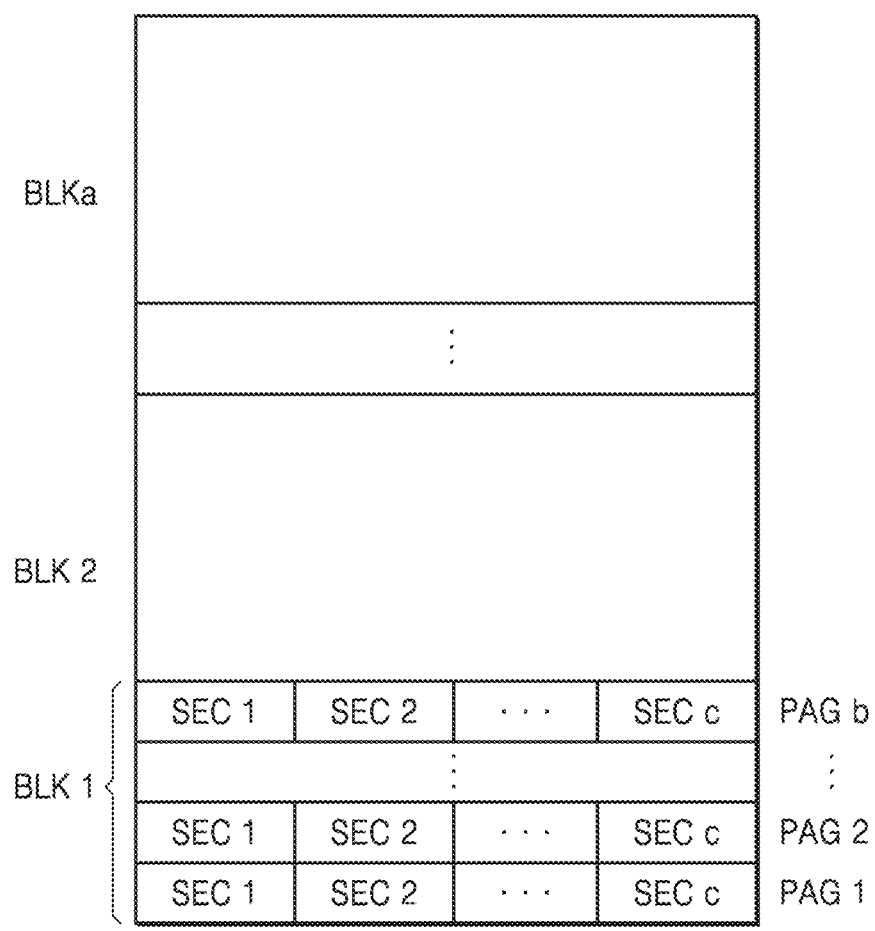
FIGS. 9A to 9C are examples of a memory cell array included in the memory device of FIG. 8.
Figure 9B:
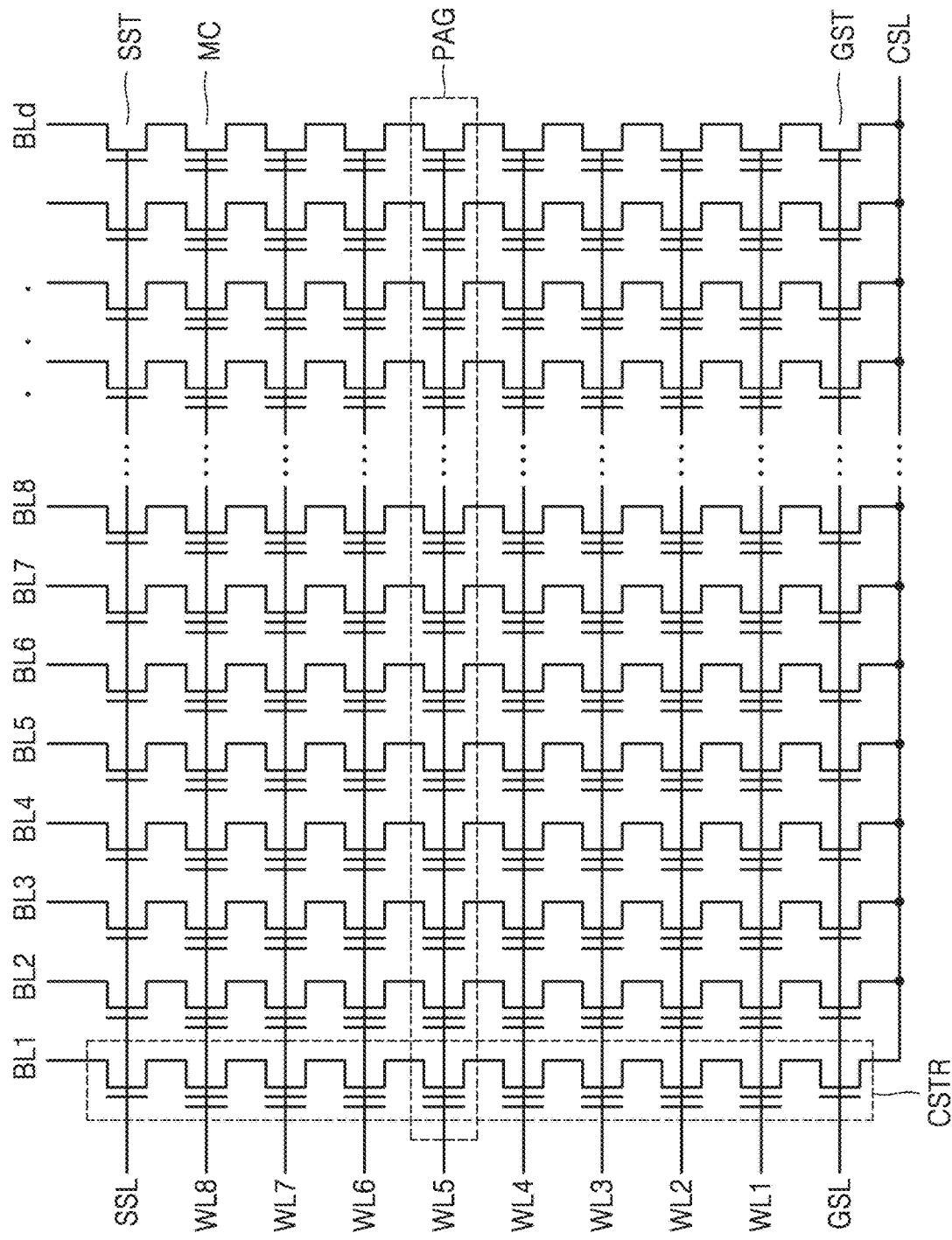
Figure 9C:
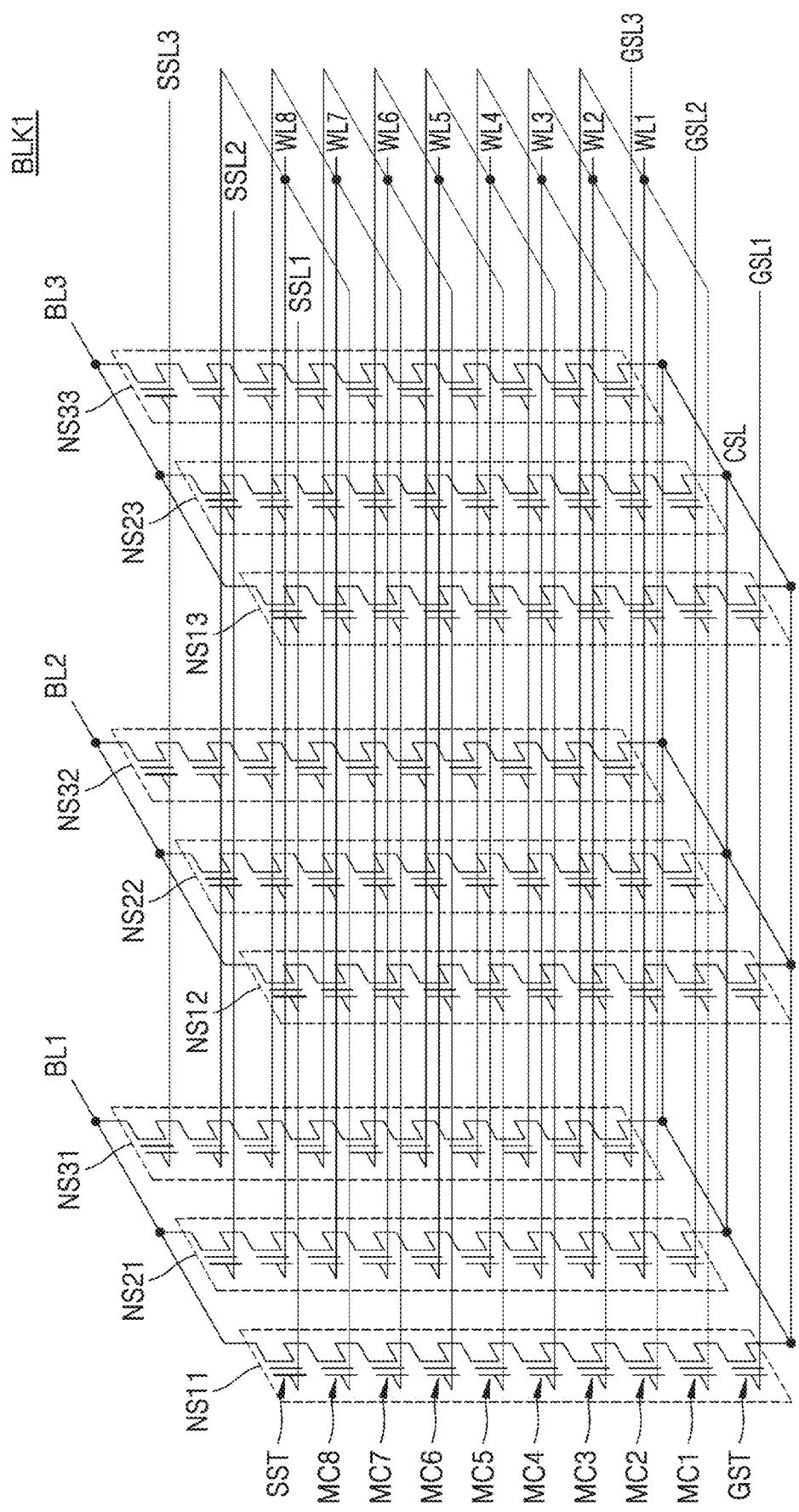

FIGS. 9A to 9C are examples of the memory cell array 121 included in the memory device 120 of FIG. 8.

Referring to FIG. 9A, the memory cell array 121 may be a flash memory cell array. Here, the memory cell array 121 may include a (a is 2 or greater integer) first to a-th memory blocks BLK1 to BLKa, each of the memory blocks BLK1 to BLKa includes b (b is 2 or greater integer) pages PAG1 to PAGb, and each of the pages PAG1 to PAGb may include c (c is 2 or greater integer) sectors SEC1 to SECc. In FIG. 9A, the pages PAG1 to PAGb and the sectors SEC1 to SECc included in one memory block BLK1 are only shown, but the other memory blocks BLK2 to BLKa may also have the same or similar structures as that of the memory block BLK1.

Referring to FIG. 9B, the memory cell array 121 may be a memory cell array of a NAND flash memory. Here, each of the memory blocks BLK1 to BLKa shown in FIG. 9A may be implemented as shown in FIG. 9B. Each of the memory blocks BLK1 to BLKa may include d (d is 2 or greater integer) cell strings CSTR, in which eight memory cells MC are connected in series, in a direction of bit lines BL1 to BLd. Each of the cell strings CSTR may include a string selection transistor SST and a ground selection transistor GST that are connected to opposite ends of memory cells MC that are connected in series. Also, the string selection transistor SST may be connected to the string selection line SSL and the ground selection transistor GST may be connected to the ground selection line GSL.

FIG. 9B shows an example in which one memory block BLK1 includes eight pages PAG with respect to eight word lines WL1 to WL8. However, each of the memory blocks BLK1 to BLKa in the memory cell array 121 according to some example embodiments may include the memory cells and the pages, wherein the number of memory cells and the number of pages may be different from the number of memory cells MC and the number of pages PAG shown in FIG. 9B.

When the other memory blocks BLK2 to BLKa are implemented like the memory block BLK1 shown in FIG. 9B, the memory cells in each of the memory blocks BLK1 to BLKa may be grouped as first to third memory cell groups 121_1 to 121_3 (see FIG. 8) according to the memory cell characteristics. For example, the first memory block BLK1 may include first to third memory cell groups 121_1 to 121_3 (see FIG. 8) having the same or similar memory cell characteristics and the second memory block BLK2 may also include first to third memory cell groups (not shown) having the same or similar memory cell characteristics. In some example embodiments, the memory blocks BLK1 to BLKa may be grouped according to the same or similar memory cell characteristics to be classified as first to third memory cell groups 121_1 to 121_3 (see FIG. 8). In some example embodiments, the control logic 122 (see FIG. 8)

may perform a test operation on the memory blocks BLK1 to BLKa to determine the memory cell characteristics of the memory blocks BLK1 to BLKa, and then classify the memory blocks BLK1 to BLKa as the first to third memory cell groups 121_1 to 121_3 (see FIG. 8).

Referring to FIG. 9C, the memory block BLK1 may be a NAND flash memory having a vertical structure, and each of the memory blocks BLK2 to BLKa shown in FIG. 9A may be also implemented as shown in FIG. 9C. The memory block BLK1 may include a plurality of NAND strings NS11 to NS33 (including memory cells MC1 to MC8), a plurality of word lines WL1 to WL8, a plurality of bit lines BL1 to BL3, a plurality of ground selection lines GSL1 to GSL3, a plurality of string selection lines SSL1 to SSL3, and/or a common source line CSL. Here, the number of NAND strings, the number of word lines, the number of bit lines, the number of ground selection lines, and/or the number of string selection lines may be variously modified.

When the other memory blocks BLK2 to BLKa are implemented like the memory block BLK1 shown in FIG. 9C, the memory cells in each of the memory blocks BLK1 to BLKa may be grouped as first to third memory cell groups 121_1 to 121_3 (see FIG. 8) according to the memory cell characteristics. For example, the first memory block BLK1 may include first to third memory cell groups 121_1 to 121_3 (see FIG. 8) having the same or similar memory cell characteristics and the second memory block BLK2 may also include first to third memory cell groups (not shown) having the same or similar memory cell characteristics. In some example embodiments, the first to third memory cell groups 121_1 to 121_3 (see FIG. 8) may be classified based on word lines. This will be described in detail below with reference to FIG. 10.

Figure 10:
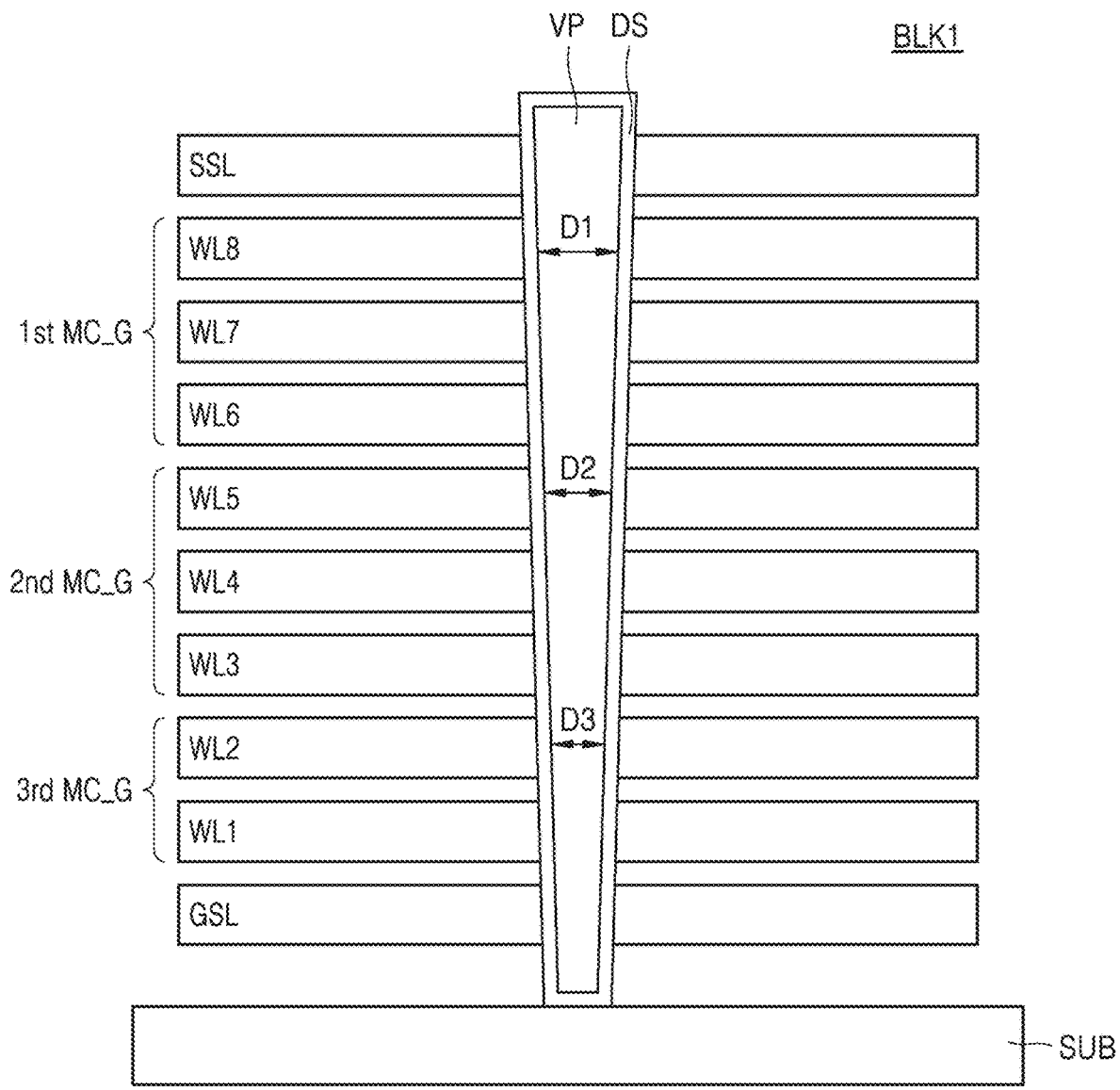
FIG. 10 is a diagram illustrating a memory block formed by a predetermined or determined processing method.

FIG. 10 is a diagram illustrating a memory block BLK1 formed by a predetermined or determined processing method.

Referring to FIG. 10, the memory block BLK1 may include first to eighth word lines WL1 to WL8, a string selection line SSL, a ground selection line GSL, a substrate SUB, a vertical semiconductor pillar VP, and/or a data storage layer DS. The vertical semiconductor pillar VP may be formed by an etching process and a polysilicon deposition process. However, due to a limitation in the processing method, the vertical semiconductor pillar VP may have a diameter that is gradually reduced towards the substrate SUB. For example, a diameter D1 corresponding to the eighth word line WL8, a diameter D2 corresponding to the fifth word line WL5, and a diameter D3 corresponding to the second word line WL2 may decrease in size according to the stated order.

The diameter of the vertical semiconductor pillar VP may be an element determining the memory cell characteristic. For example, cell speeds of the memory cells that are connected to sixth to eighth word lines WL6 to WL8 corresponding to a wider diameter area of the vertical semiconductor pillar VP may be relatively slow, and cell speeds of the memory cells that are connected to the first and second word lines WL1 and WL2 corresponding to a narrower diameter area of the vertical semiconductor pillar VP may be relatively fast. Also, memory retention periods of the memory cells that are connected to sixth to eighth word lines WL6 to WL8 corresponding to a wider diameter area of the vertical semiconductor pillar VP may be relatively long, and memory retention periods of the memory cells that are connected to the first and second word lines WL1 and WL2 corresponding to a narrower diameter area of the vertical semiconductor pillar VP may be relatively short.

Accordingly, the memory cells connected to the sixth to eighth word lines WL6 to WL8 may be grouped as a first memory cell group 1st MC_G, the memory cells connected to the third to fifth word lines WL3 to WL5 may be grouped as a second memory cell group 2nd MC_G, and the memory cells connected to the first and second word lines WL1 and WL2 may be grouped as a third memory cell group 3rd MC_G. That is, the memory cell speeds may be fast in an order of the third memory cell group 3rd MC_G, the second memory cell group 2nd MC_G, and the first memory cell 1st MC_G (e.g., with the third memory cell group 3rd MC_G having the slowest memory cell speeds and the first memory cell 1st MC_G having the fastest memory cell speeds), and the memory cell retention periods may be short in an order of the third memory cell group 3rd MC_G, the second memory cell group 2nd MC_G, and the first memory cell group 1st MC_G (e.g., with the third memory cell group 3rd MC_G having the longest memory cell retention periods and the first memory cell 1st MC_G having the shortest memory cell retention periods). The first memory cell group 1st MC_G is the closest to the string selection line SSL, the second memory cell group 2nd MC_G is next closest to the string selection line SSL, and the third memory cell group 3rd MC_G is the closest to the ground selection line GSL.

However, some example embodiments are not limited to the example of grouping the memory cell groups in FIG. 10, that is, the memory cell groups may be variously grouped based on locations of the word lines.

Figure 11:
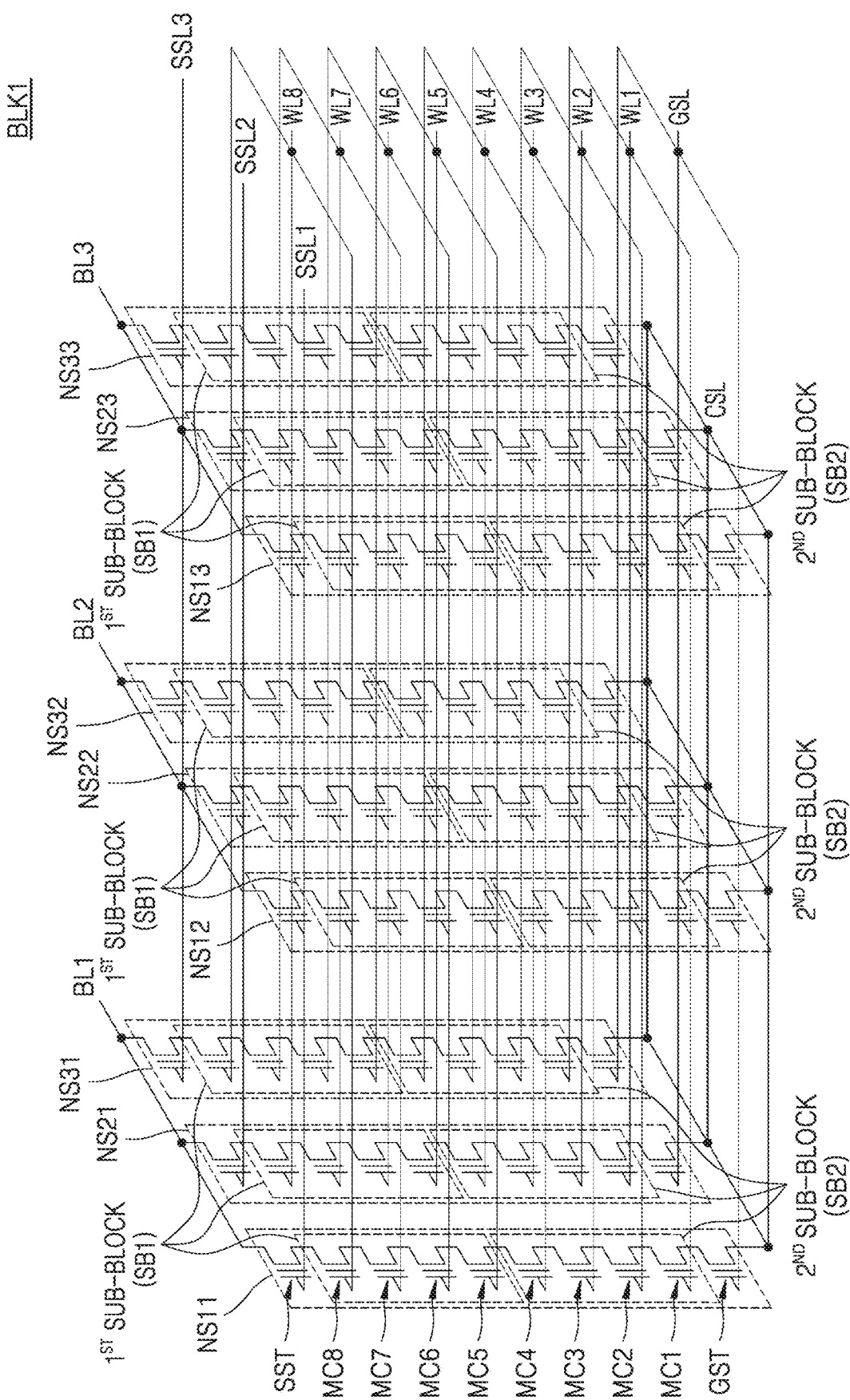
FIG. 11 is a diagram illustrating a memory block of FIG. 9C divided in sub-block units.
Figure 12:
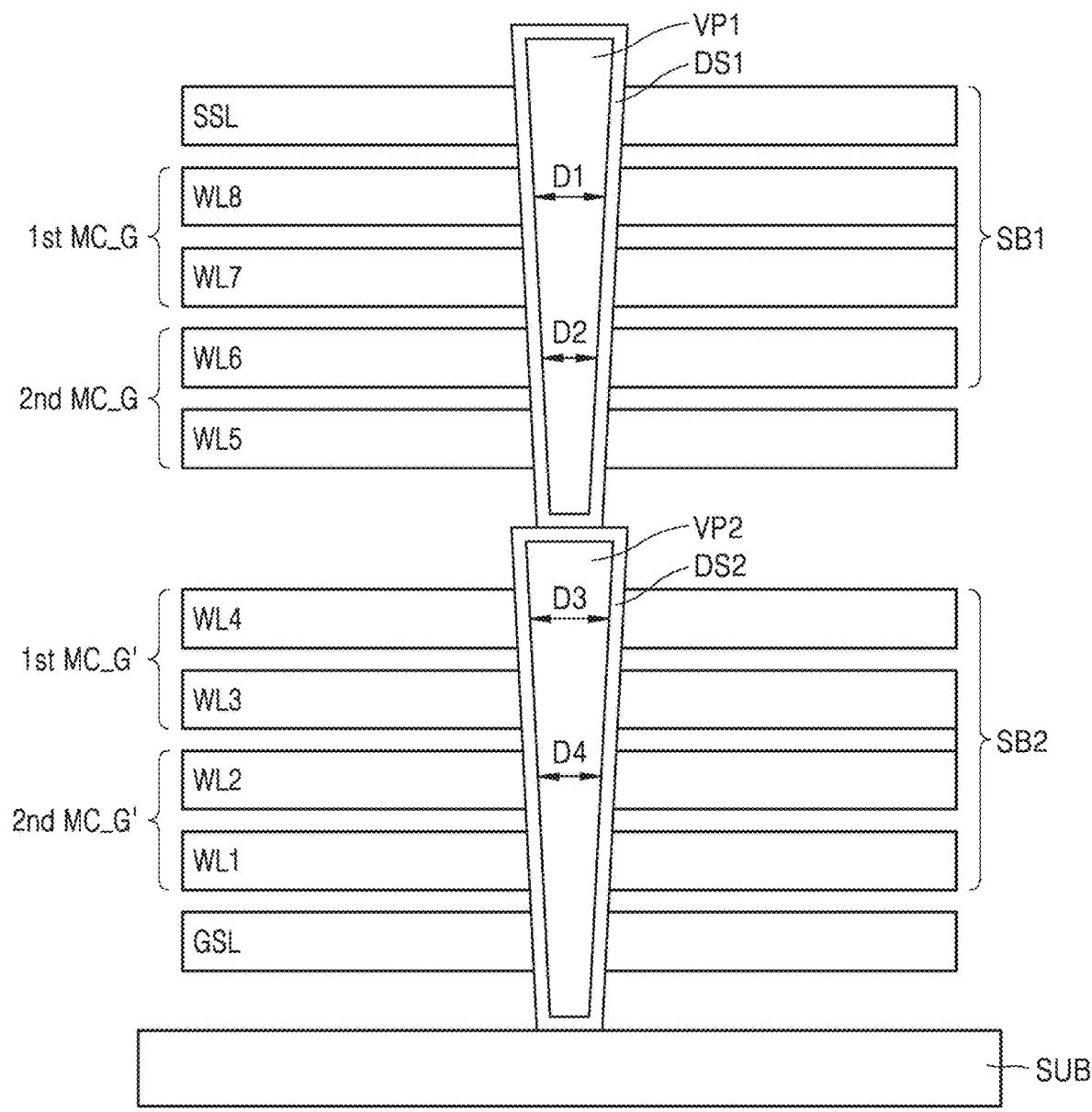
FIG. 12 is a diagram of a memory block formed by a different processing method as that of FIG. 10.

FIG. 11 is a diagram illustrating the memory block BLK1 of FIG. 9C divided in sub-blocks, and FIG. 12 is a diagram illustrating the memory block BLK1 formed in a different processing method from that of FIG. 10. Hereinafter, descriptions that are already provided above with reference to FIGS. 9C and 10 are omitted.

Referring to FIG. 11, fifth to eighth memory cells MC5 to MC8 may configure a first sub-block SB1 and first to fourth memory cells MC1 to MC4 may configure a second sub-block SB2. A sub-block may be a unit on which a partial erasing operation of the memory device is possibly performed.

Referring to FIG. 12, the memory block BLK1 may include first to eighth word lines WL1 to WL8, a string selection line SSL, a ground selection line GSL, a substrate SUB, first and second vertical semiconductor pillars VP1 and VP2, and/or data storage layers DS1 and DS2. The second vertical semiconductor pillar VP2 may be formed between the first vertical semiconductor pillar VP1 and the substrate SUB. For example, before forming the first vertical semiconductor pillar VP1, the second vertical semiconductor pillar VP2 may be formed by an etching process and a polysilicon deposition process. After forming the second vertical semiconductor pillar VP2, the first vertical semiconductor pillar VP1 may be formed on the second vertical semiconductor pillar VP2 through an additional etching process and a polysilicon deposition process. Diameters of the first vertical semiconductor pillar VP1 and the second vertical semiconductor pillar VP2 may have the same or similar profiles. For example, a diameter D1 of the first vertical semiconductor pillar VP1 corresponding to the eighth word line WL8 may be the same as or similar to a diameter D3 of the second vertical semiconductor pillar VP2 corresponding to the fourth word line WL4, and a diameter D2 of the first vertical semiconductor pillar VP1 corresponding to the sixth word line WL6 may be the same as or similar to a diameter D4 of the second vertical semiconductor pillar VP2 corresponding to the second word line WL2.

According to some example embodiments, the memory cells connected to the fifth to eighth word lines WL5 to WL8 may configure the first sub-block SB1 and the memory cells connected to the first to fourth word lines WL1 to WL4 may configure the second sub-block SB2. Also, the memory cell groups according to some example embodiments may be defined for each of the sub-blocks. That is, in the first sub-block SB1, the memory cells connected to the seventh and eighth word lines WL7 and WL8 may be grouped as the first memory cell group 1st MC_G and the memory cells connected to the fifth and sixth word lines WL5 and WL6 may be grouped as the second memory cell group 2nd MC_G. The first memory cell group 1st MC_G may be relatively close to the string selection line SSL and the second memory cell group 2nd MC_G may be relatively close to the ground selection line GSL.

In the second sub-block SB2, the memory cells connected to the third and fourth word lines WL3 and WL4 may be grouped as the first memory cell group 1st MC_G' and the memory cells connected to the first and second word lines WL1 and WL2 may be grouped as the second memory cell group 2nd MC_G'. The first memory cell group 1st MC_G' may be relatively close to the string selection line SSL, and the second memory cell group 2nd MC_G' may be relatively close to the ground selection line GSL.

Structures of the sub-blocks SB1 and SB2 shown in FIGS. 11 and 12 are examples to which some example embodiments are applied, and some example embodiments are not limited thereto, that is, each of the sub-blocks SB1 and SB2 may include more word lines, and moreover, may further include at least one dummy word line.

FIGS. 13A and 13B are diagrams illustrating state shaping information according to some example embodiments. FIG. 13A illustrates state shaping information used in a state shaping operation suitable for the memory cell characteristic of each memory cell group when the memory cell groups are grouped in each of the memory blocks, and FIG. 13B illustrates state shaping information used in a state shaping operation suitable for the memory cell characteristic of each memory cell group when the memory cell groups are grouped in each of the sub-blocks.

Referring to FIG. 13A, the memory cell array of the memory device includes the plurality of memory blocks BLK1 to BLKa, and each of the memory blocks BLK1 to BLKa may be divided as a plurality of memory cell groups. For example, the first memory block BLK1 may include first to m-th memory cell groups MC_G1_1 to MC_Gm_1 and the a-th memory block BLKa may include first to n-th memory cell groups MC_G1_k to MC_Gn_k. The memory device may generate state shaping information SS_Info. representing the memory cell characteristic of each of the first to m-th memory cell groups MC_G1_1 to MC_Gm_1 and the first to n-th memory cell groups MC_G1_k to MC_Gn_k. The memory controller may perform the state shaping operation on data that is programmed in each of the memory blocks BLK1 to BLKa based on the state shaping information SS_Info. generated as in FIG. 13A.

Referring to FIG. 13B, the memory cell array includes the plurality of memory blocks BLK1 to BLKa, each of the memory blocks BLK1 to BLKa includes a plurality of sub-blocks, and each of the sub-blocks may be divided as a plurality of memory cell groups. For example, the memory block BLK1 may include first to d-th sub-blocks SB_11 to SB_d1 and each of the first to d-th sub-blocks SB_11 to SB_d1 may include a plurality of memory cell groups. In detail, the first sub-block SB_11 may include first to f-th memory cell groups MC_G1_11 to MC_Gf_11 and the d-th sub-block SB_d1 may include first to g-th memory cell groups MC_G1_d1 to MC_Gg_d1. In addition, the memory block BLKa may include first to e-th sub-blocks SB_1a to SB_ea and each of the first to e-th sub-blocks SB_1a to SB_ea may include a plurality of memory cell groups. In detail, the first sub-block SB_1a may include first to h-th memory cell groups MC_G1_1a to MC_Gh_1a and the e-th sub-block SB_ea may include first to i-th memory cell groups MC_G1_ea to MC_Gi_ea.

The memory controller may perform the state shaping operation on data that is programmed in the sub-blocks of each of the memory blocks BLK1 to BLKa based on the state shaping information SS_Info. generated as in FIG. 13B.

Figure 14:
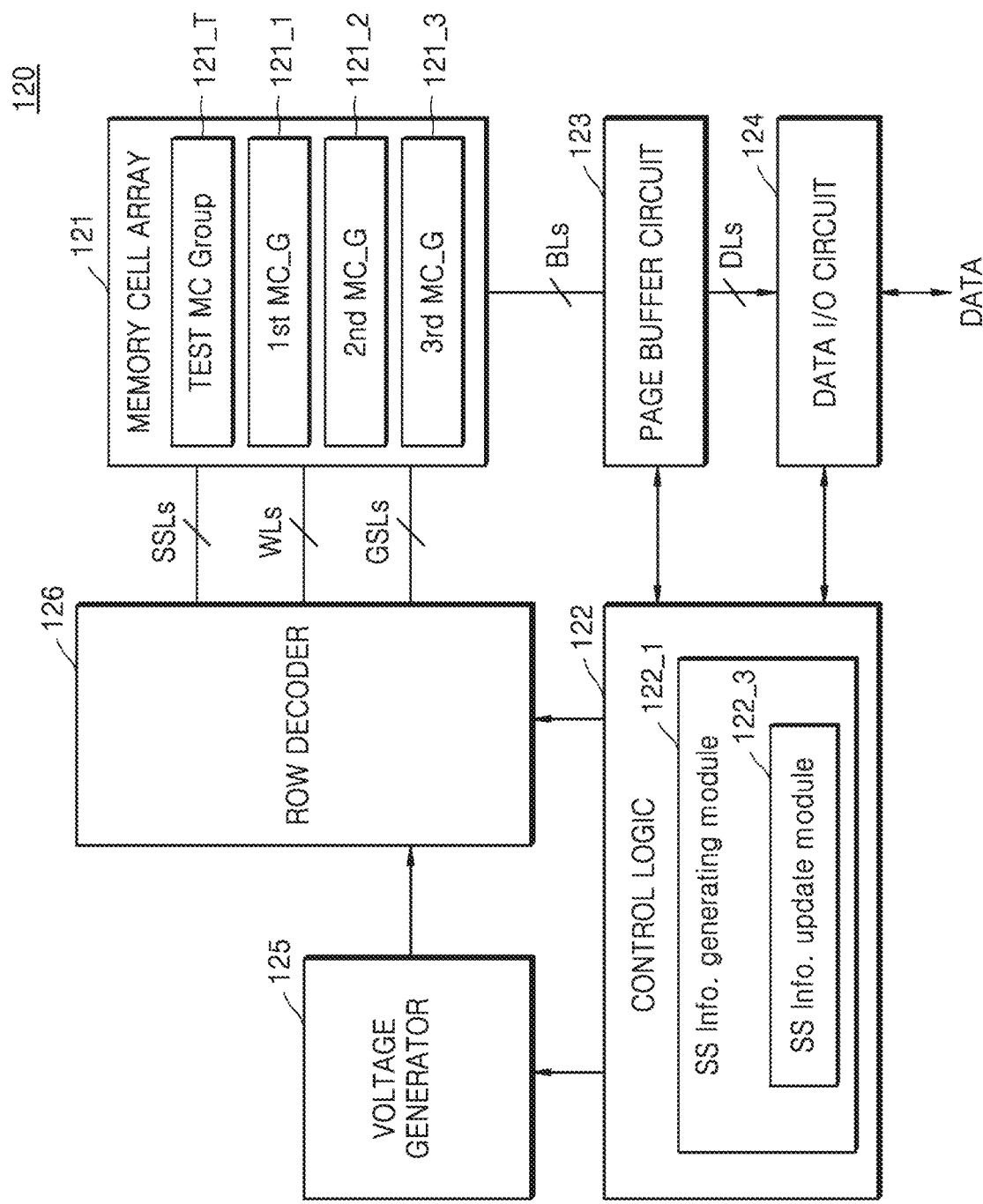
FIG. 14 is a block diagram of a memory device according to some example embodiments.

FIG. 14 is a block diagram of the memory device 120 according to some example embodiments. Hereinafter, descriptions that are provided above with reference to FIG. 8 are omitted.

Referring to FIG. 14, the state shaping information generation module 122_1 of the control logic 122 may include a state shaping information update module 122_3. The memory cells included in the first to third memory cell groups 121_1 to 121_3 of the memory cell array 121 may have variable memory cell characteristics that vary depending on the number of programming/erasing (P/E) operations, memory operating environment, etc. Accordingly, in order to continue the effect of improving reliability in the state shaping operation according to some example embodiments, the variable memory cell characteristics may be considered. The state shaping information update module 122_3 according to some example embodiments may monitor variation in the memory cell characteristics of the first to third memory cell groups 121_1 to 121_3 and may update the state shaping information based on a monitoring result.

Also, the memory cell array 121 may further include a test memory cell group 121_T. The test memory cell group 121_T may include memory cells that are used to monitor the variation in the memory cell characteristics of the first to third memory cell groups 121_1 to 121_3. In some example embodiments, the test memory cell group 121_T may include some of the memory cells included in the first to third memory cell groups 121_1 to 121_3 or may include additional memory cells having the same or similar memory cell characteristics as/to those of the first to third memory cell groups 121_1 to 121_3. The state shaping information update module 122_3 may monitor the variation in the memory cell characteristics of the first to third memory cell groups 121_1 to 121_3 through a test result after performing a test operation on the test memory cell groups 121_T and may update the state shaping information to represent the changed memory cell characteristic when the variation in the memory cell characteristics exceeds a critical value. According to some example embodiments, the critical value may be a design parameter determined through empirical study. The control logic 122 may provide the memory controller 110 with the updated state shaping information.

Figure 15:
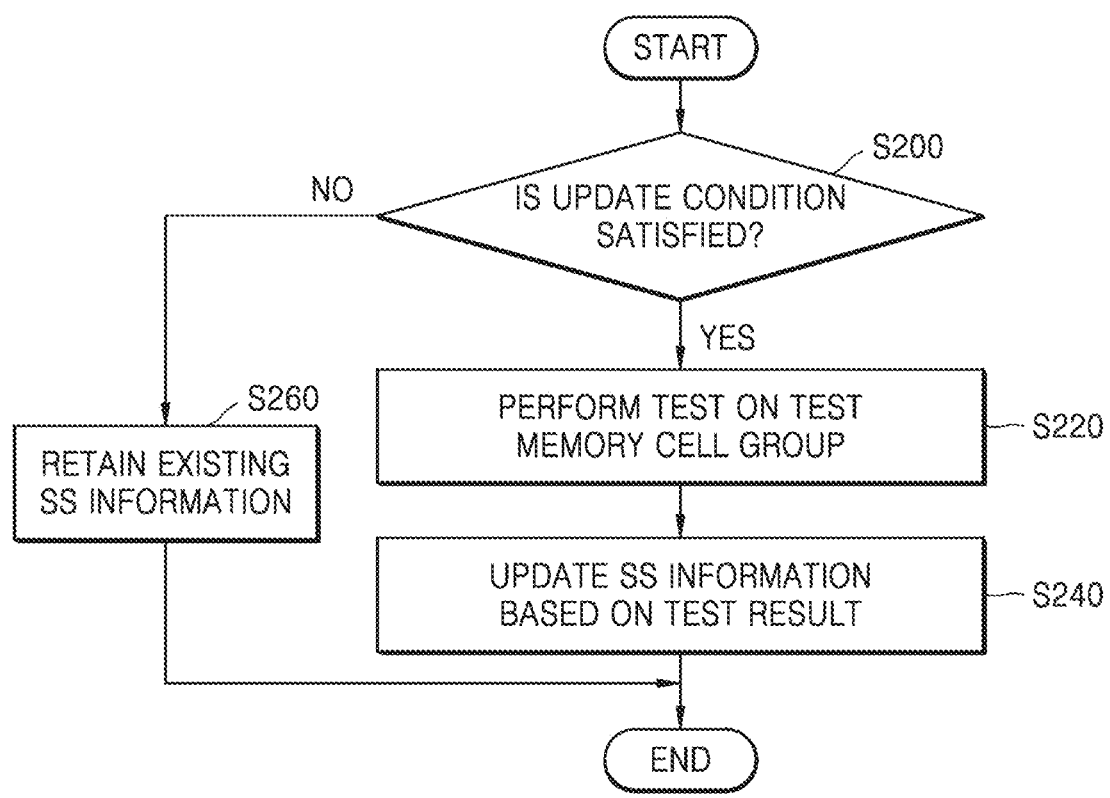
FIG. 15 is a flowchart illustrating an operation of updating state shaping information of a memory device according to some example embodiments.

FIG. 15 is a flowchart illustrating an operation of updating state shaping information of a memory device according to some example embodiments.

Referring to FIG. 15, in operation S200, the memory device may determine whether a condition of updating state shaping (SS) information is satisfied. For example, the memory device may determine whether the update condition is satisfied based on the number of P/E operations, the memory operating environment (e.g., temperature, operation mode, etc.), etc., and when the number of P/E operations exceeds a reference number or when the temperature exceeds a reference temperature in the memory operating environment, the memory device may determine that the condition of updating the state shaping (SS) information is satisfied. According to some example embodiments, the reference number and reference temperature may be design parameters determined through empirical study. When the update condition is satisfied ("YES" in operation S200), operation S220 may be performed, and in operation S220, the memory device may perform a test on the memory cell group. In operation S240, the memory device may update the state shaping (SS) information based on the test result. When the update condition is not satisfied ("NO" in operation S200), operation S260 may be performed, and in operation S260, the memory device may retain the existing state shaping information. In some example embodiments, the memory device may perform an update operation of the state shaping information in response to a predetermined or determined command received from the memory controller 110.

Figure 16A:
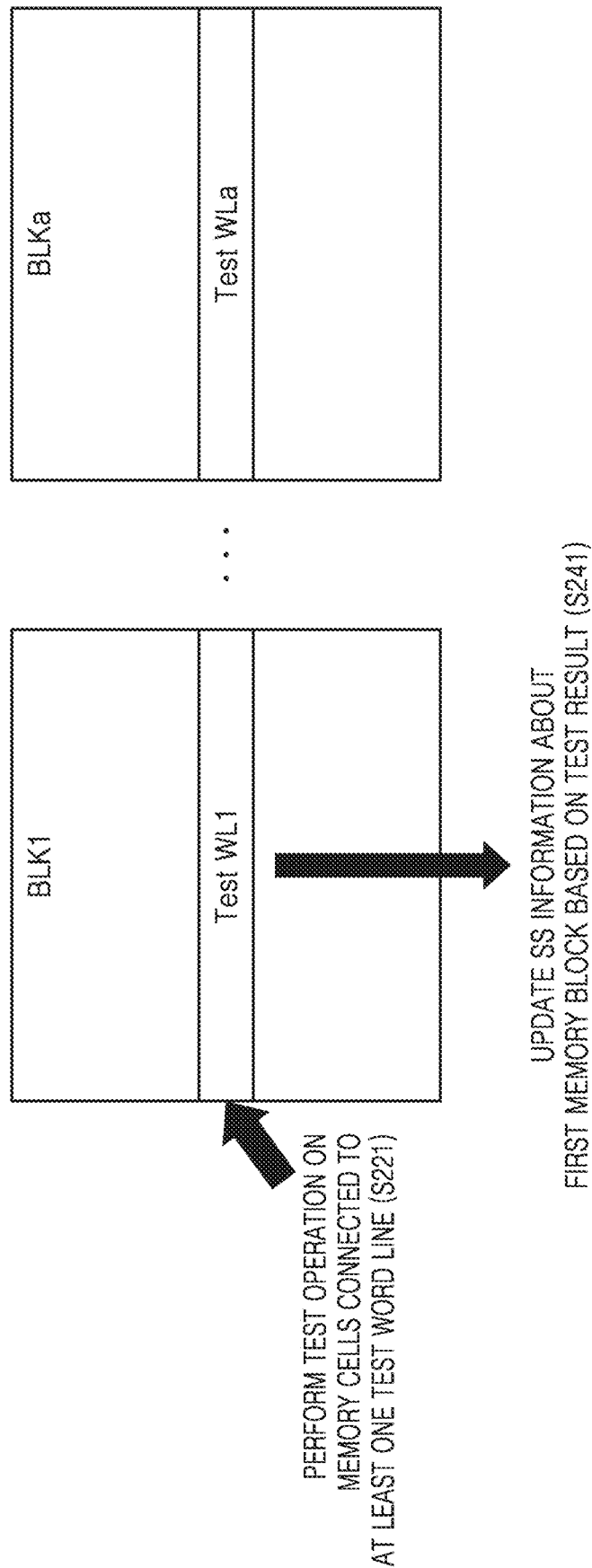
FIGS. 16A and 16B are diagrams illustrating an operation of updating state shaping information of a memory device according to some example embodiments.
Figure 16B:
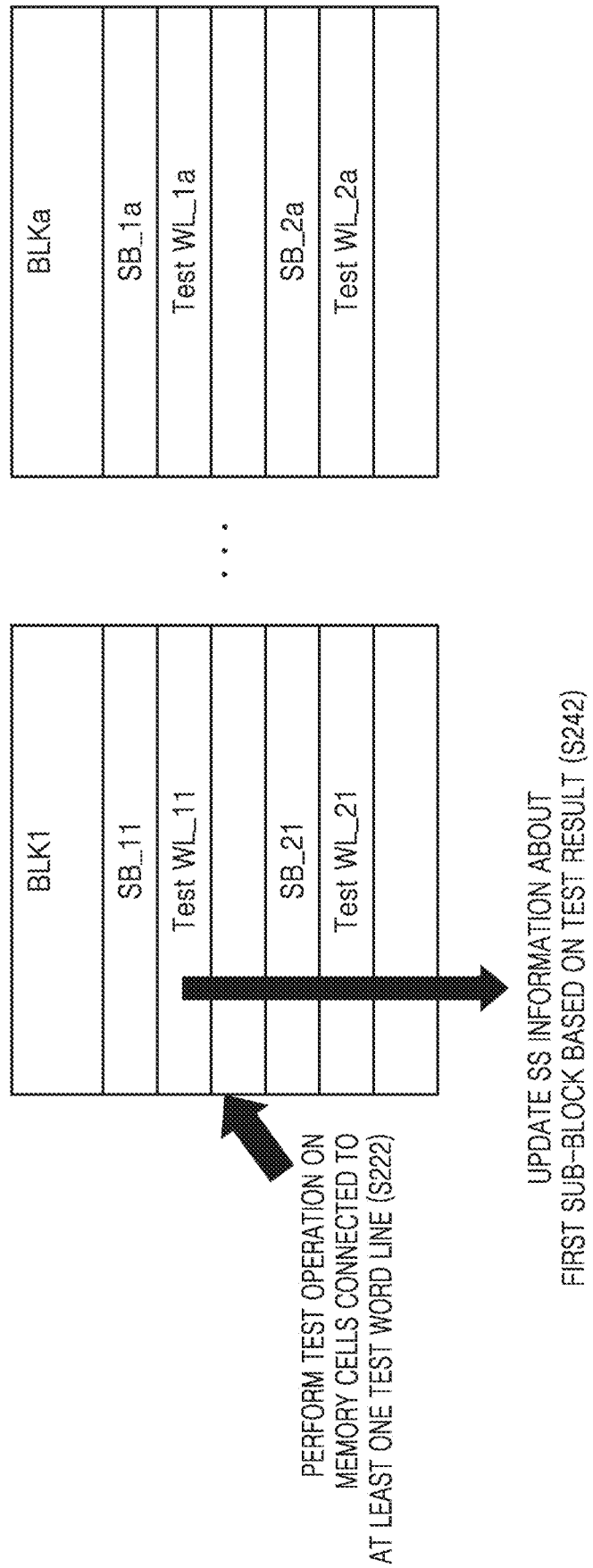

FIGS. 16A and 16B are diagrams illustrating an operation of updating state shaping information of a memory device according to some example embodiments.

Referring to FIG. 16A, each of the memory blocks BLK1 to BLKa may include at least one test word line (Test WL1 to Test WLa) and each of the test word lines Test WL1 to Test WLa may be set in advance for updating the state shaping information. In operation S221, the memory device may perform a test operation on memory cells connected to at least one test word line Test WL1. In operation S241, the memory device may update the state shaping information about the memory block BLK1 (that is, state shaping information about the memory cell groups included in the memory block BLK1) based on the test result. In detail, the memory device may reflect the memory cell characteristics of the memory cells connected to the test word line Test WL1, wherein the memory cell characteristics are obtained as the test operation result, to the state shaping information. In the above manner, the memory device may update the state shaping information about the other memory blocks BLK2 to BLKa.

Referring to FIG. 16B, each of the memory blocks BLK1 to BLKa may include a plurality of sub-blocks, and each of the sub-blocks may include at least one test word line. For example, the memory block BLK1 may include first and second sub-blocks SB_11 and SB_21, and the first sub-block SB_11 may include a first test word line Test WL_11 and the second sub-block SB_21 may include a second test word line Test WL_21. Also, the memory block BLKa may include first and second sub-blocks SB_1a and SB_2a, and the first sub-block SB_1a may include a first test word line Test WL_1a and the second sub-block SB_2a may include a second test word line Test WL_2a.

In operation S222, the memory device may perform a test operation on the memory cells connected to the at least one test word line Test WL_11. In operation S242, the memory device may update the state shaping information about the first sub-block SB_11 (that is, state shaping information about memory cell groups included in the first sub-block SB_11) based on the test result. Also, operation S222 and operation S242 may be applied to the second sub-block SB_21 so as to update the state shaping information about the second sub-block SB_21. In the above manner, the memory device may update the state shaping information about the other memory blocks BLK2 to BLKa.

Figure 17A:
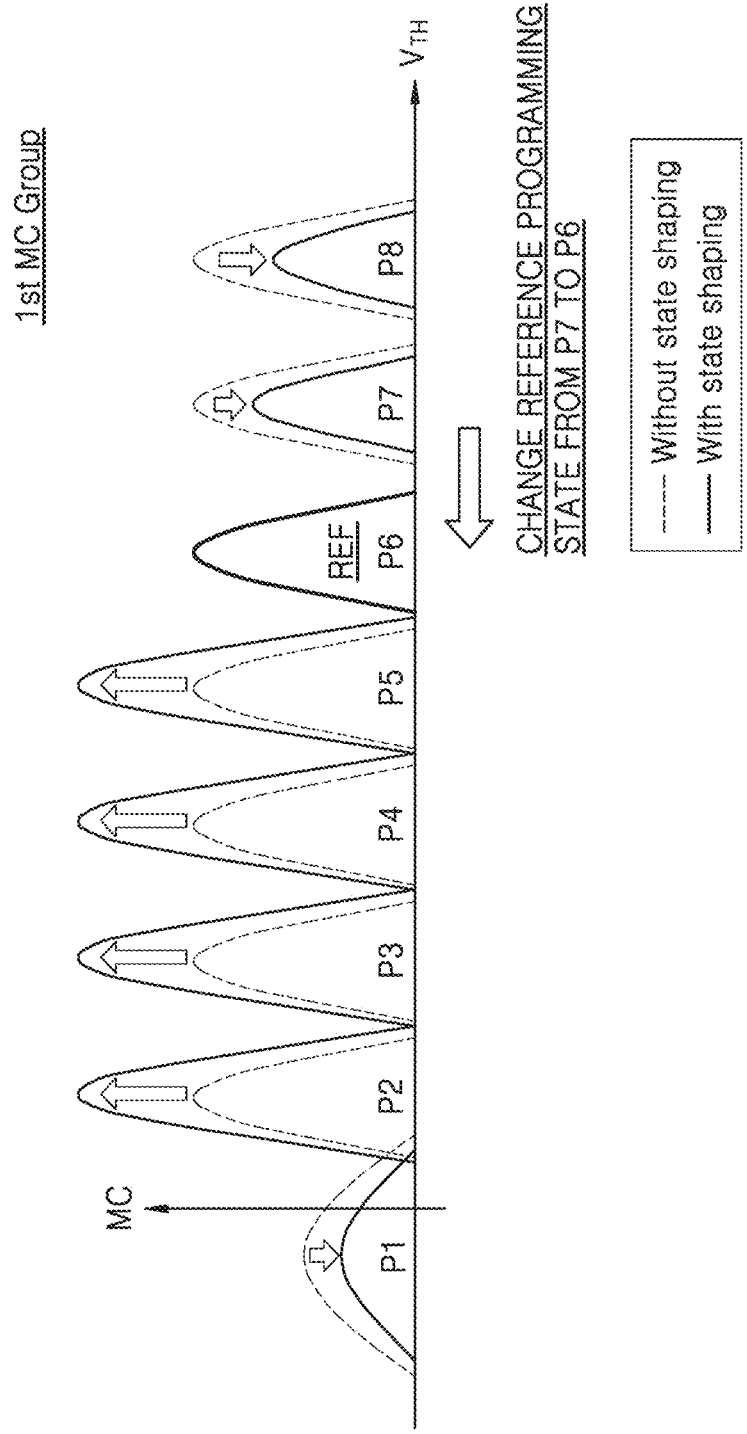
FIGS. 17A and 17B are diagrams illustrating an example of performing a state shaping operation performed by a memory controller based on updated state shaping information, according to some example embodiments.
Figure 17B:
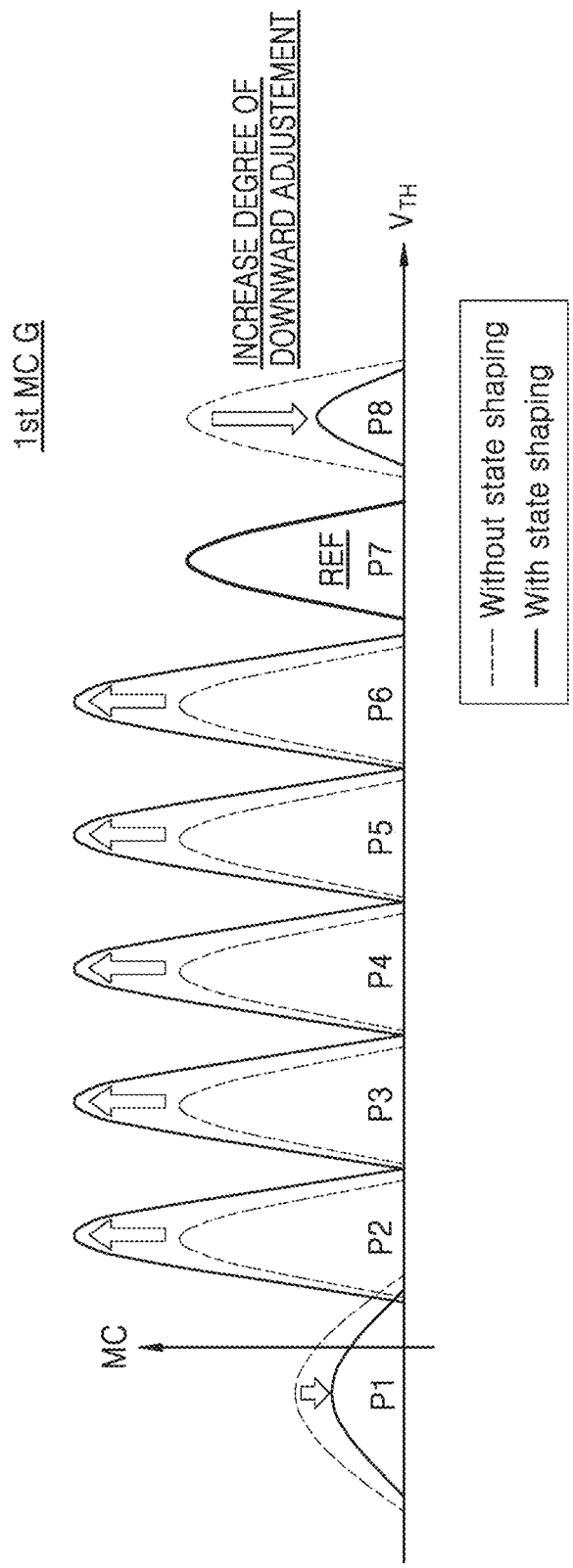

FIGS. 17A and 17B are diagrams illustrating an example of performing a state shaping operation performed by a memory controller based on updated state shaping information, according to some example embodiments. Hereinafter, for convenience of description about FIGS. 17A and 17B, FIGS. 4A and 5A are further referred to.

Referring to FIG. 17A, the state shaping module 112 may change a determined programming policy with respect to the first memory cell group 121_1 based on the updated state shaping information. That is, unlike in FIG. 5A, the state shaping module 112 changes the sixth programming state P6 into the reference programming state REF, and may reduce the number of memory cells corresponding to the seventh and eighth programming states P7 and P8 that are higher levels than the sixth programming state P6.

Referring to FIG. 17B, unlike in FIG. 17A, the state shaping module 112 maintains the reference programming state REF, and may increase a downward adjustment degree of the number of memory cells corresponding to the eighth programming state P8.

Although not shown in the drawings, the state shaping module 112 may change the reference programming state based on the updated state shaping information by applying the technical concept illustrated with reference to FIGS. 17A and 17B and may change the degree of downward adjustment of the number of memory cells corresponding to the target programming state.

As described above, the memory controller according to some example embodiments may adaptively perform the state shaping operation on the data taking into account the memory cell characteristics that are variable, and thus, data reliability of the memory device may be improved.

Figure 18:
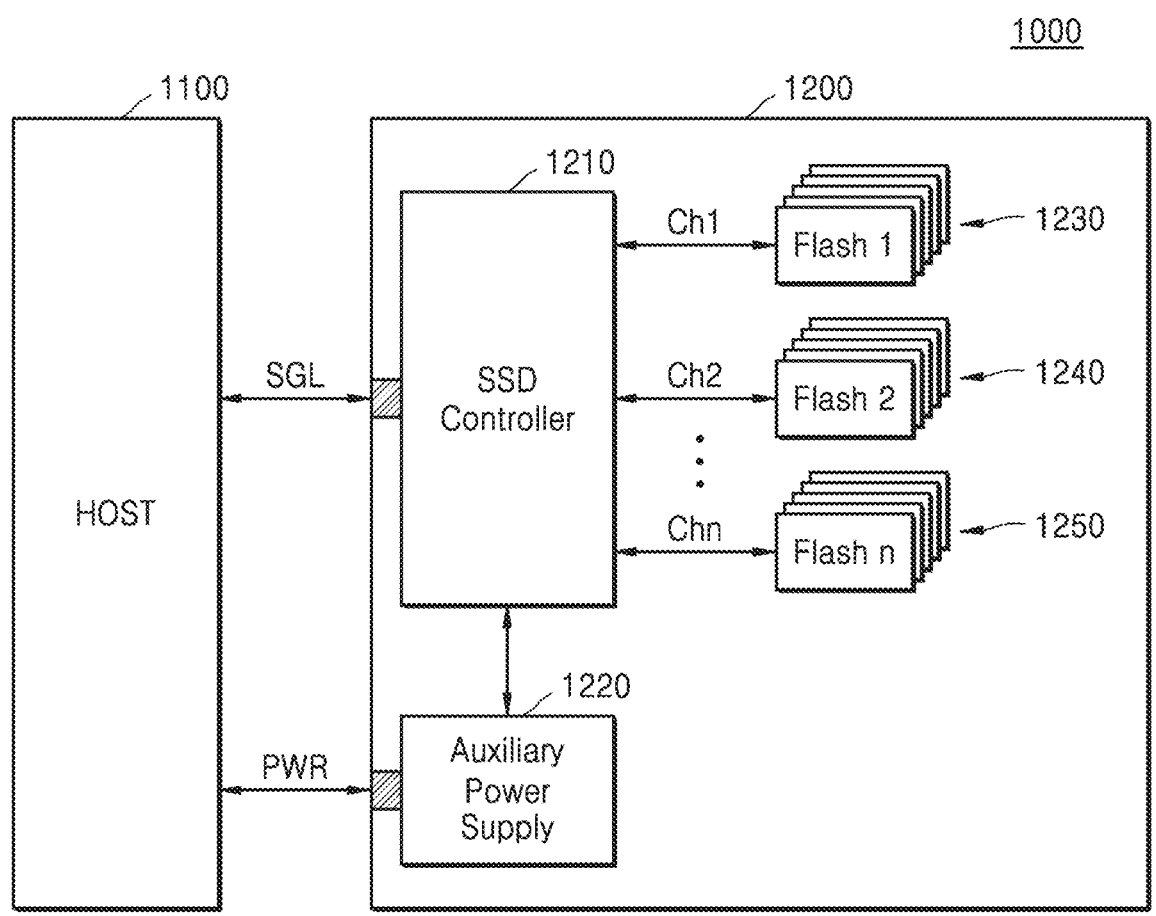
FIG. 18 is a block diagram of a solid state drive (SSD) system according to some example embodiments.

FIG. 18 is a block diagram of a solid state drive (SSD) system 1000 according to some example embodiments.

Referring to FIG. 18, the SSD system 1000 may include a host 1100 and/or an SSD 1200. The SSD 1200 may exchange signals SGL with the host 1100 via a signal connector and receive an input of electric power PWR via a power connector. The SSD 1200 may include an SSD controller 2210, an auxiliary power device 1220, and/or a plurality of memory devices 1230, 1240, and 1250.

The SSD controller 2210 according to some example embodiments may perform the state shaping operation on the data, taking into account memory cell characteristics of each of the plurality of memory devices 1230, 1240, and 1250. The memory cells having the same or similar memory cell characteristics may be grouped and the plurality of memory devices 1230, 1240, and 1250 may generate the state shaping information representing the memory cell characteristics of each of the memory cell groups and provide the state shaping information to the SSD controller 2210. Also, the plurality of memory devices 1230, 1240, and 1250 may update the state shaping information by monitoring the variation in the memory cell characteristics of each memory cell group, and may provide the updated state shaping information to the SSD controller 2210. According to some example embodiments, operations described herein as being performed by the SSD controller 2210 may be performed by processing circuitry.

While some example embodiments been particularly shown and described, it will be understood that various changes in form and details may be made therein without departing from the spirit and scope of the following claims.

What is claimed is:

1. A method of operating a memory controller, the method comprising:
   performing a state shaping operation on received data based on state shaping information in response to a write request, the received data and the write request being received from a host, the state shaping information representing a memory cell characteristic corresponding to a memory cell group on which the received data is to be programmed, and the state shaping information being received from a memory device; and transmitting transformation data to the memory device, the transformation data being generated through the state shaping operation, wherein the performing the state shaping operation includes determining a reference programming state among a plurality of programming states formed by the memory cell group based on the state shaping information; and transforming a first value corresponding to a first programming state of the plurality of programming states to a second value corresponding to a second programming state of the plurality of programming states, the first programming state being higher than the reference programming state and the second programming state being lower than the reference programming state.

2. The method of claim 1, wherein the state shaping information comprises:

at least one of a memory cell speed characteristic of the memory cell group or a memory cell retention characteristic of the memory cell group.

3. The method of claim 1, wherein the performing a state shaping operation comprises:

determining a programming policy related to the reference programming state, the programming policy indicating a number of memory cells corresponding to each of a plurality of programming states formed by the memory cell group, the plurality of programming states including the first programming state, the second programming state and the reference programming state; and transforming the received data based on the programming policy.

4. The method of claim 3, wherein the determining a programming policy comprises:

determining a number of target programming states from among the plurality of programming states based on the state shaping information, the target programming states being programming states for which the number of memory cells is decreased according to the programming policy.

5. The method of claim 4, wherein the determining a number of target programming states comprises:

determining the number of target programming states to be higher in response to a memory cell speed being faster in the memory cell group or a memory cell retention period being shorter in the memory cell group.

6. The method of claim 4, wherein the target programming states include a plurality of target programming states; and the determining a programming policy determines the programming policy such that a degree of decrease of the number of memory cells increases as a level of the plurality of target programming states increases.

7. The method of claim 4, wherein the target programming states include the first programming state; and the target programming states do not include the second programming state.

8. The method of claim 1, further comprising:

receiving a read request from the host;

receiving the transformation data stored in the memory cell group from the memory device in response to the read request;

performing a state shaping inverse-transformation operation on the transformation data; and transmitting data generated by the state shaping inverse-transformation operation to the host.

9. A method of operating a memory system including a memory device and a memory controller, the method comprising:

performing, by the memory controller, a first state shaping operation on first data using a reference programming state corresponding to a first memory cell retention characteristic of a first memory cell group of the memory device; and causing, by the memory controller, the memory device to program first transformation data in the first memory cell group by transmitting the first transformation data to the memory device, the first transformation data being generated by the first state shaping operation, wherein the performing the first state shaping operation includes transforming a first value corresponding to a first programming state to a second value corresponding to a second programming state, the first programming state being higher than the reference programming state and the second programming state being lower than the reference programming state.

10. The method of claim 9, wherein the method further comprises:

performing, by the memory controller, a second state shaping operation on second data based on a second memory cell characteristic of a second memory cell group of the memory device, the second memory cell characteristic being different from the first memory cell retention characteristic; and causing, by the memory controller, the memory device to program second transformation data to the second memory cell group by transmitting the second transformation data to the memory device, the second transformation data being generated by the second state shaping operation.

11. The method of claim 10, wherein a first target distribution of a plurality of programming states in the first memory cell group is different from a second target distribution of a plurality of programming states in the second memory cell group due to the first state shaping operation and the second state shaping operation.

12. The method of claim 10, wherein the memory device includes a memory block connected between a plurality of ground selection lines and a plurality of string selection lines, the memory block including a plurality of memory cells stacked in a vertical direction;

the first memory cell group includes first memory cells among the plurality of memory cells connected to at least one first word line among a plurality of word lines connected to the memory block, the at least one first word line being closer to the plurality of string selection lines than to the plurality of ground selection lines; and the second memory cell group includes second memory cells among the plurality of memory cells connected to at least one second word line among the plurality of word lines, the at least one second word line being closer to the plurality of ground selection lines than to the plurality of string selection lines.

13. The method of claim 10, wherein
- the memory device includes a memory block connected between a plurality of ground selection lines and a plurality of string selection lines, the memory block including a plurality of memory cells stacked in a vertical direction and at least two sub-blocks;
- the first memory cell group includes first memory cells among the plurality of memory cells connected to at least one first word line among a plurality of word lines, the plurality of word lines being included in a first sub-block among the at least two sub-blocks, the at least one first word line being closer to the plurality of string selection lines than to the plurality of ground selection lines; and
- the second memory cell group includes second memory cells among the plurality of memory cells connected to at least one second word line among the plurality of word lines, the at least one second word line being closer to the plurality of ground selection lines than to the plurality of string selection lines.

14. The method of claim 9, further comprising:
- generating, by the memory device, state shaping information representing the first memory cell retention characteristic; and
- transmitting, by the memory device, the state shaping information to the memory controller for performing the first state shaping operation.

15. A memory system comprising:
- a memory device including a first memory cell group; and
- a memory controller configured to,
  - cause the memory device to program first transformation data in the first memory cell group by transmitting the first transformation data to the memory device, the first transformation data being generated by performing a state shaping operation on first data, in which the first data is to be programmed,
  - wherein the memory controller is configured to perform the state shaping operation by determining a reference programming state based on the first memory cell characteristic of the first memory cell group to transform an initial value of the first data to have a transformed value corresponding to one of a plurality of programming states at a lower level than the reference programming state, the initial value of the first data corresponding to one of the plurality of programming states at a higher level than the reference programming state.

16. The memory system of claim 15, wherein the memory device is configured to:
- generate state shaping information representing the first memory cell characteristic; and
- transmit the state shaping information to the memory controller for performing the state shaping operation on the first data.

17. The method of claim 1, further comprising:
- monitoring the memory cell characteristic of the memory cell group; and
- updating the state shaping information based on a result of the monitoring.

* * * * *